(12) United States Patent
Kobayashi

(10) Patent No.: US 6,458,629 B2
(45) Date of Patent: Oct. 1, 2002

(54) HIGH-FREQUENCY MODULE, METHOD OF MANUFACTURING THEREOF AND METHOD OF MOLDING RESIN

(75) Inventor: Kazuhiko Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/804,035

(22) Filed: Mar. 13, 2001

(30) Foreign Application Priority Data

Jun. 29, 2000 (JP) ........................................ 2000-196965

(51) Int. Cl.⁷ .............................................. H01L 21/44
(52) U.S. Cl. ....................... 438/127; 438/106; 438/112
(58) Field of Search .................. 438/106, 112, 438/126, 127; 264/219, 220, 222, 272.17

(56) References Cited

U.S. PATENT DOCUMENTS 5,750,423 A * 5/1998 Ishii ........................... 438/112
5,972,735 A * 10/1999 Dominic ..................... 438/118
5,999,413 A * 12/1999 Ohuchi et al. .............. 361/772

FOREIGN PATENT DOCUMENTS

JP 2001-012737 1/2001

* cited by examiner

*Primary Examiner*—Michael Sherry
*Assistant Examiner*—Scott B. Geyer
(74) *Attorney, Agent, or Firm*—Staas & Halsey LLP

(57) ABSTRACT

A method of molding resin on a thin-film resin substrate having a first surface provided with an electronic circuit and a second unleveled surface opposite the first surface is disclosed. The method includes the steps of: a) providing deformation restricting means for the substrate; and b) molding the resin on the first surface.

27 Claims, 28 Drawing Sheets

HIGH-FREQUENCY MODULE, METHOD OF MANUFACTURING THEREOF AND METHOD OF MOLDING RESIN

BACKGROUND OF THE INVENTION

1. Field of the Invention

The present invention generally relates to a method of molding resin on a substrate, and particularly relates to a method of molding resin on a thin-film resin substrate that works well for high-frequency characteristics and a high-frequency module.

2. Description of the Related Art

There is a rapid decrease in size, thickness and weight of electronic equipment such as portable mobile communication terminals. The portable mobile terminals are installed with high-frequency modules, such as power amplifiers and high-frequency circuit boards.

Thus, it is necessary to reduce size, thickness and weight of the high-frequency modules to further reduce the size, thickness and weight of such portable mobile terminals. For this purpose, it has been proposed to select a thin-film resin substrate that can achieve further reduction of size, thickness and weight and can improve the high-freguency characteristics.

However, due to its reduced thickness, the thin-film resin substrates are often deformed during a manufacturing process of the high-frequency module. Accordingly, there is a need for a resin molding method which can restrict the deformation of the thin-film resin substrate during the manufacturing process.

FIGS. 1A and 1B are diagrams showing an example of a high-frequency module 1 of the related art. FIG. 1A is a plan view showing general structure of the high-frequency module 1. FIG. 1B is a cross-sectional view showing general construction of the high-frequency module 1. Such high-frequency module 1 may be used, for example, as a power amplifier of a portable mobile terminal. It is desirable to further reduce the size, thickness and weight of the high-frequency module 1.

Generally, the high-frequency module 1 includes a high-frequency circuit board 2, a high-frequency active chip 3, chip components 4, and a resin package 5. The high-frequency circuit board 2 includes a base material 15 of ceramics, glass-ceramics, or glass-epoxy. On a first (upper) surface of the base material 15, high-frequency circuit interconnections 6 and 7, direct-current (DC) circuit interconnections 8 and 9, and pad portions 12 to 14 are provided in a predetermined pattern. On a second (lower) surface of the base material 15, a ground layer 18 and land portions 19 are provided.

The high-frequency circuit board 2 of the above structure is provided with an opening 16 formed at a predetermined position of the base material 15. The high-frequency active chip 3 is mounted in the opening 16. Also, the high-frequency active chip 3 and each of the interconnections 6 to 9 are electrically connected by wires 17.

Also, a plurality of chip components 4 are mounted on the high-frequency circuit board 2. Each chip component 4 is joined to the interconnections 6 to 9 by means of a conductive material. Further, the pad portions 12 to 14 are electrically connected to the ground layer 18 formed on the second (lower) surface of the base material by means of via holes 20 formed through the base material 15.

A high-frequency input terminal RFIn, a high-frequency output terminal RFout and bias terminals 10 and 11 are provided at predetermined end portions of respective interconnections 6 to 9. The terminals RFIn, RFout, 10 and 11, respectively, are electrically connected to land portions 19 serving as external connection terminals by means of the via holes 20 formed through the base material 15.

When the high-frequency module 1 is mounted on the mounting board, the land portions 19 will be electrically connected to the mounting board. Also, a first (upper) surface of the high-frequency circuit board 2 is sealed, for example, using a metal cap (not shown).

However, if the base material 15 of the high-frequency circuit board 2 is made of ceramics, the cost of the high-frequency module will be increased since a ceramics material is more expensive than a resin material. If the base material 15 of the high-frequency circuit board 2 is made of materials such as ceramics, glass-ceramics or glass-epoxy, it is difficult to reduce the thickness of the base material 15 below 100 $\mu$m. Thus, this is contrary to the aim of reducing the thickness of the high-frequency module 1.

Also, it is difficult to implement a machining process on the prior art material used for the base material 15 with high accuracy. This is particularly problematic when forming the via holes 20. With the high-frequency module 1 for processing high-frequency signals, it is preferable to reduce impedance. However, since it is difficult to optionally select the thickness of the base material 15 and the diameter of the via hole 20, the impedance could not be reduced with the high-frequency module 1 of the related art. Accordingly, with the high-frequency module 1 of the related art, it is not possible to avoid any degradation of the characteristics due to the via holes 20.

Also, with the high-frequency module 1, it is desired to achieve a broader band with the same signal line width. In order to achieve broader band with the same signal line width, it is necessary to reduce the thickness of the base material 15 comprising the high-frequency circuit board 2 and to reduce the relative permittivity.

However, since the base material 1 has comparatively great thickness and relative permittivity, it is difficult to achieve broader band using the same signal line width. Therefore, with the circuit layout in a millimeter wave region using ceramics having high relative permittivity, the width of a 50 Ω signal line becomes extremely small and thus becomes difficult to form such signal line.

In order to solve the problems described above, the inventor has proposed a high-frequency module 30A as shown in FIGS. 2 to 6 (JP 11-310159 A1).

Generally, the high-frequency module 30A includes a high-frequency circuit board 32A, a high-frequency active chip 33, chip components 34, and a resin package 35. The characteristic feature of the high-frequency circuit board 32A is that it includes a base material 45 of polyimide.

On a first (upper) surface of the base material 45, high-frequency circuit interconnections 36A and 37A (microstrip lines, coplanar lines etc.), direct-current (DC) circuit interconnections 38A and 39A, and pad portions 42 to 44 are formed in a predetermined pattern. The high-frequency circuit interconnections 36A and 37A are formed as so-called 50Ω lines.

The interconnections 36A to 38A, 39 and the pad portions 42 to 44, respectively, are made of a copper film or a gold film with a thickness of, for example, 35 microns. The predetermined regions of the high-frequency circuit interconnections 36A, 37A and the DC circuit interconnections 38A and 39 constitute microstrip lines and a bias circuit of λ/4. A second (lower) surface of the base material 45 is provided with a grounded ground layer 48A and land portions 49A to serve as external connection terminals.

A high-frequency active chip 33 is mounted on the high-frequency circuit board 32A of the above structure. An opening 46 is formed in the base material 45 at a position at which the active chip 33 is to be mounted. Also, a bottom open end of the opening 46 is closed by the ground layer 48A. Therefore, at a predetermined position of the high-frequency circuit board 32A at which the high-frequency active chip 33 is to be mounted, a recessed portion is defined by the opening 46 and the ground layer 48A.

The high-frequency active chip 33 is mounted in the opening 46 and is joined to the bottom ground layer 48A by means of gold-tin alloy or conductive adhesive agent. With the base material 45 provided with the ground layer 48A and the opening 46 and by mounting the high-frequency active chip 33 on the ground layer 48A in the opening 46, heat produced by the high-frequency active chip 33 can be dissipated in an efficient manner.

Also, the high-frequency active chip 33 and each interconnection 36A to 39A are electrically connected by wires 47. Since the high-frequency active chip 33 is positioned inside the opening 46, the wire bonding level of the high-frequency active chip 33 and the wire bonding level of the respective interconnections 36A to 39 are equal. Thus, wire bonding characteristic can be improved and the height of the wire loop can be reduced.

Also, a plurality of chip components 34 are mounted on a first (upper) surface of the high-frequency circuit board 32A. Each chip component 34 is joined to respective interconnection 36A to 38A and 39 or to the pad portions 42 to 44 by means of solder or conductive adhesive agent. The chip component 34 is a chip capacitor which together with the high-frequency circuit interconnections 36A and 37A form an input/output matching circuit. Although not shown in the diagrams referred to in the above description, a hybrid circuit (branch-line, coupler, rat-race, phase-reversion type hybrid, high-frequency filter, etc.) may be provided the first surface of the high-frequency circuit board 32A.

Also, the pad portions 42 to 44 are electrically connected to the ground layer 48A formed on the second surface of the base material 45 by means of via holes (not shown) formed through the base material 45. Further, a high-frequency input terminal 53, a high-frequency output terminal 54 and bias terminals 40 and 41 are formed at predetermined positions of the respective interconnections 36A to 38A. By means of the via holes 50 formed through the base material 45, the respective interconnections 40, 41, 53, and 54 are electrically connected to land portions 49A serving as external terminals.

As shown in FIG. 6, the land portions 49A are formed on the second surface of the base material 45 so as to be electrically separated from the ground layer 48A. The land portions 49A are electrically connected to the mounting board (not shown) when mounting the high-frequency module 30B. It is to be noted that, for ease of understanding, the via holes 50 are illustrated in FIG. 3, which is a cross-sectional diagram of FIG. 2 along line A—A, but practically, the via holes 50 do not appear in such a cross-sectional diagram.

Also, a resin package 35 is formed on the first surface of the high-frequency circuit board 32A. The resin package 35 is formed by, for example, transfer molding (hereinafter referred to as molding) and serves to protect the high-frequency active chip 33, the chip component 34, and the interconnections 36A to 38A and 39 that are formed on the first surface of the high-frequency circuit board 32A.

The high-frequency module 30A of the above structure uses a thin-film resin board of polyimide as the base material 45 of the high-frequency circuit board 32A. Since polyimide is less expensive compared to ceramics, the cost can be reduced in comparison to the high-frequency circuit board 2 with base material 15 of material such as ceramics (see FIG. 1).

Also, by using the base material 45 of polyimide, the thickness of the base material 45 can be reduced to about 25 to 75 $\mu$m. Thus, the width of the 50$\Omega$ lines can be reduced to about 50 to 150 $\mu$m, which in turn gives reduced area occupied by the 50$\Omega$ lines on the high-frequency circuit board 32A. Accordingly, it is possible to achieve reduced size and thickness of the high-frequency module 30A.

Also, although polyimide has a low relative permittivity of about 3.1, when the thin-film resin board of polyimide is used, the width of the 50$\Omega$ lines can be reduced by reducing its thickness. Therefore, it is no longer necessary to use a base material having high relative permittivity (e.g., ceramics, glass-ceramics, glass-epoxy etc.) which gives comparatively large thickness of the base material. This also serves to reduce the size and thickness of the high-frequency module 30A.

In general, as the frequency used becomes higher, the impedance of the interconnections 36A and 37A becomes greater. The less the thickness of the base material 45, the rate of increase of the impedance becomes smaller. Therefore, by using the polyimide having low relative permittivity as the base material 45, with a small thickness, low impedance can be maintained at a broad band frequency. Thus, an improved high-frequency circuit having high-frequency characteristics at broad band frequency can be achieved.

As has been described above, with the high-frequency module 30A shown in FIGS. 2 to 6, by using a thin-film resin board of polyimide as the base material 45, it is possible to provide a high-frequency circuit board 32A having an improved high-frequency characteristic at broad band frequency, low thermal resistivity and low cost. Thus, by incorporating the high-frequency module 30A of the present embodiment into a portable mobile terminal, a portable mobile terminal with reduced thickness can be achieved at a low cost.

Also, the base material 45 is a flexible substrate. Therefore, the high-frequency module 30A can be provided which can be provided at a low cost and which is not affected by the shape of the portable mobile terminal when the high-frequency module 30A is mounted on a portable mobile terminal.

However, the inventor has found that the base material 45 may be deformed during a molding step for forming the resin package 35. This will be described in detail in the following description.

As has been described above, the ground layer 48A and the land portions 49A are formed on the second surface of the high-frequency circuit board 32A. As shown in FIGS. 5 and 6, the land portions 49A are spaced apart at a predetermined interval (e.g., 600 $\mu$m)

Thus, the base material 45 is exposed at positions between neighboring land portions 49A. Also, the thickness of the ground layer 48A and the land portions 49A is, for example, 35 $\mu$m. Therefore, since the land portions 49A are raised and the portions where the base material 45 is exposed are recessed, the second surface of the high-frequency circuit board 32A becomes unleveled, or uneven ease FIG. 7 shows a resin molding step for forming the resin package 35. During the resin molding step, the high-frequency circuit board 32A is placed in mold 60A. The mold 60A comprises an upper mold 61A and a lower mold 62A. Cavities 63A and 64A are formed in the upper and lower molds 61A and 62A, respectively.

The cavity 63A of the upper mold 61A corresponds to the shape of the resin package 35 and the cavity 64A of the lower mold 62A has a planar shape. Therefore, when the high-frequency circuit board 32A is placed in the mold 60A, the land portions 49A touches the cavity 64A and gaps are formed at portions where the recessed portions 51 face the cavities 64A.

When resin 66 is injected into the cavities 63A, 64A from a gate 65 of the mold 64A, the base material 45 which is a thin-film resin substrate will be pressed by an injection pressure exerted by the resin 66. Since the gaps are formed at positions where the recessed portions 51 face the cavities 64A, the base material 45 deforms and sags at the gaps as indicated by dash-dot lines in FIG. 7.

Such deformation of the base material 45 may cause various problems. For example, the chip components 34 may fall off from the high-frequency circuit board 34A and the interconnections 36A, 37A, 38A, 39 may peel off from the base material 45. Further, the interconnections 36A, 37A, 38A, 39 may be disconnected due to stress applied thereto.

SUMMARY OF THE INVENTION

Accordingly, it is a general object of the present invention to provide a method which can solve or at least reduce the problems described above.

It is another and more specific object of the present invention to provide a method of resin molding for a thin-film resin substrate which can restrict deformation of the high-frequency circuit board (thin-film resin substrate) during the step of forming a resin package.

In order to achieve the above objects according to the present invention, a method of molding resin on a thin-film resin substrate is provided, the thin-film resin substrate having a first surface provided with an electronic circuit and a second unleveled surface opposite the first surface, the second surface having raised portions and recessed portions, the method including the steps of:

a) providing deformation restricting means for the substrate; and
b) molding the resin on the first surface.

With the such a method, the recessed parts of the second unleveled surface are reinforced by the deformation restricting means. Therefore, the deformation of the thin-film resin substrate is restricted even if the thin-film resin substrate is biased due to the pressure exerted by the resin during the molding step.

It is still another object of the present invention to provide a high-frequency module that can be manufactured with reduced deformation of the thin-film resin substrate.

In order to achieve the above object, a high-frequency module includes:

a thin-film resin substrate having a first surface provided with high-frequency circuit components including high-frequency circuit connections and a second unleveled surface opposite the first surface, the second surface having raised portions and recessed portions;
a resin sealing formed on the first surface of the thin-film resin substrate; and
deformation restricting means.

With the high-frequency module described above, the recessed parts of the second unleveled surface are reinforced by the deformation restricting means. Therefore, the deformation of the thin-film resin substrate is restricted even if the thin-film resin substrate is biased due to the pressure exerted by the resin during the molding step.

The deformation restricting means may be a sub-member is made of a thermally resistive hard resin having an unleveled surface including raised portions and recessed portions with the raised portions and recessed portions being provided in a negative pattern of the configuration of the second surface.

Other objects and further features of the present invention will be apparent from the following detailed description when read in conjunction with the accompanying drawings.

DETAILED DESCRIPTION OF THE PREFERRED EMBODIMENTS

In the following, principles and embodiments of the present invention will be described with reference to the accompanying drawings.

Figure 8:
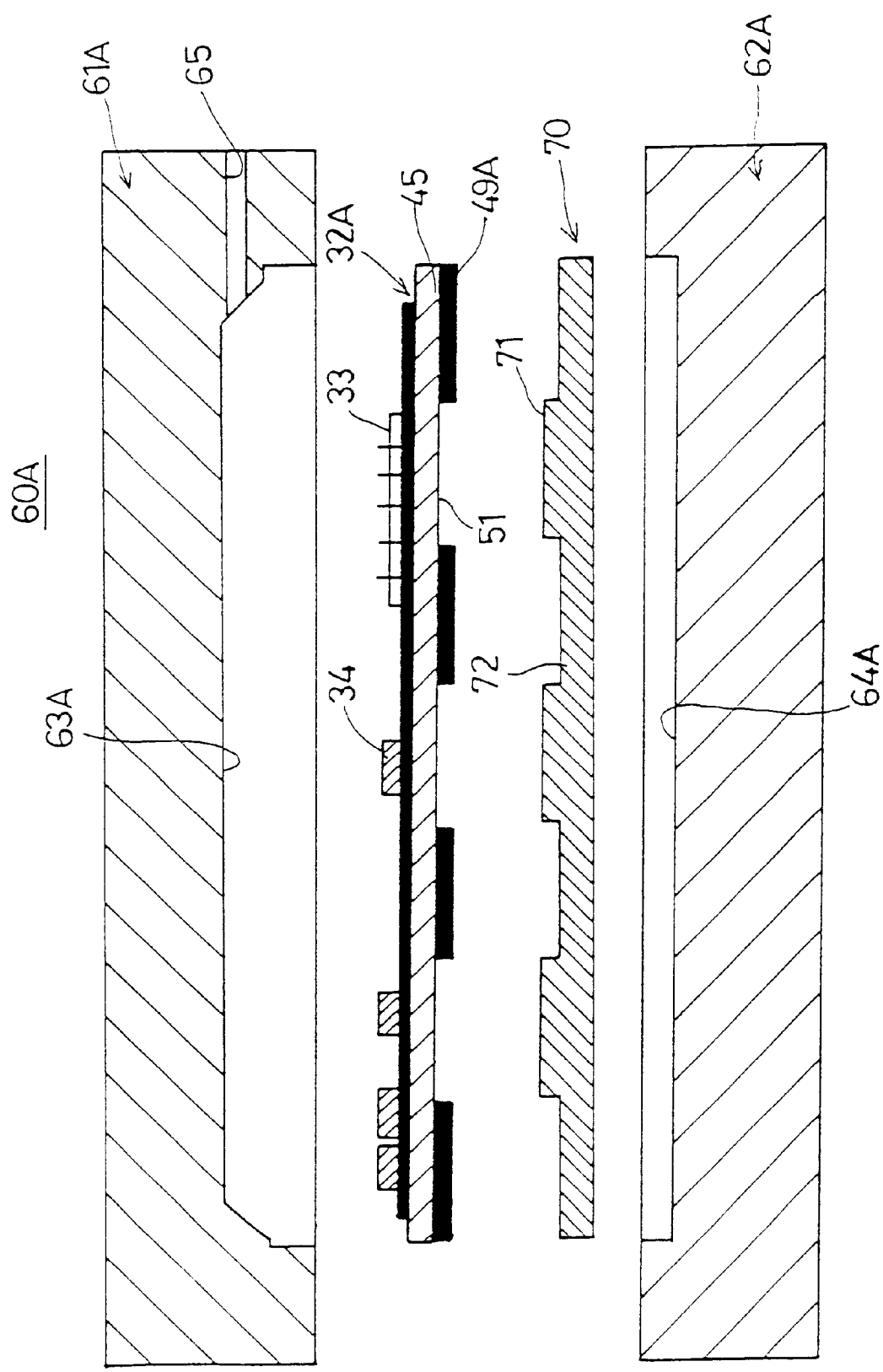
FIG. 8 is a schematic cross-sectional diagram of a first embodiment of the present invention showing how upper and lower molds are clamped in the resin molding process.
Figure 9:
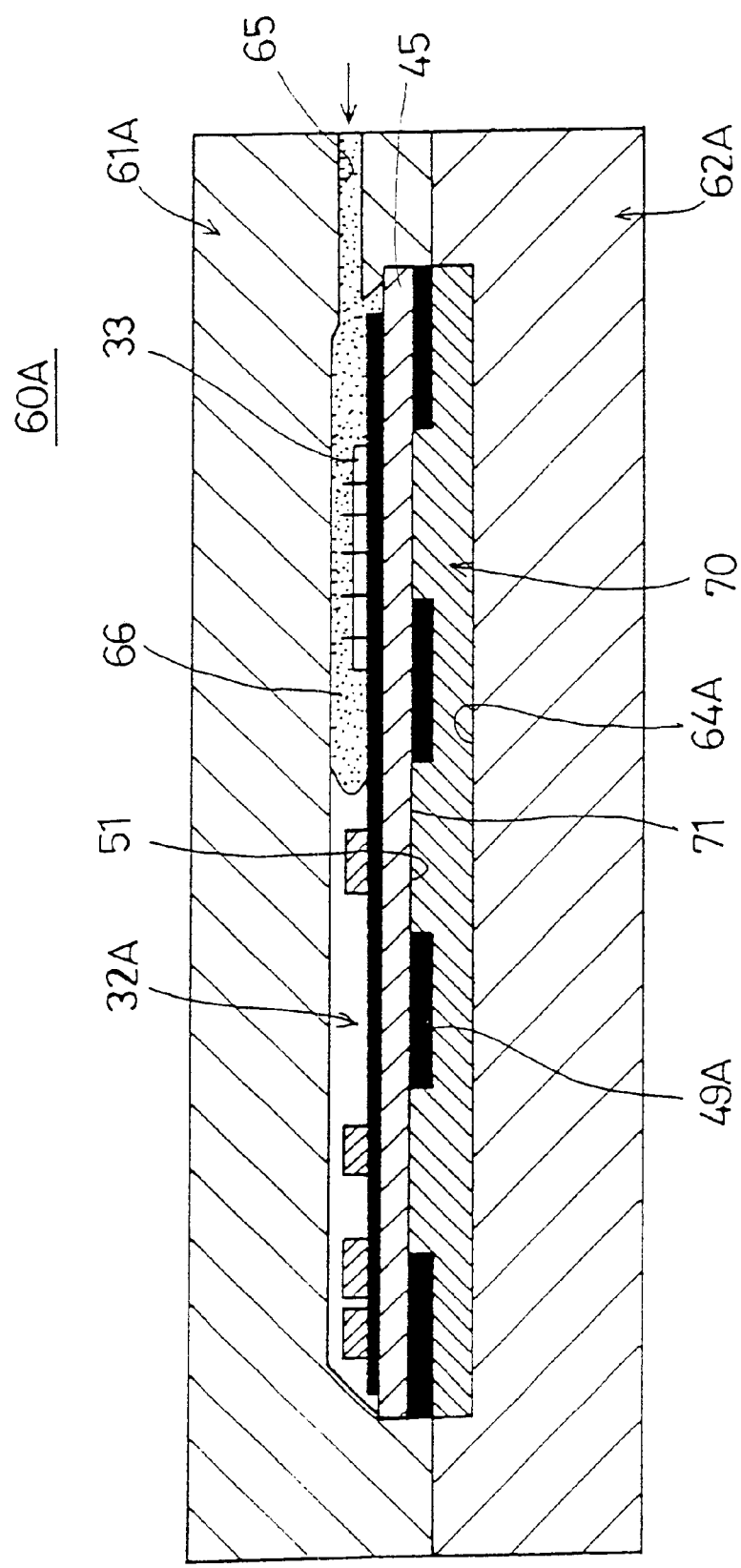
FIG. 9 is a schematic cross-sectional diagram of a first embodiment of the present invention showing how resin is injected in the resin molding step.

FIGS. 8 and 9 are diagrams showing a first embodiment of the present invention. The present embodiment relates to a method of manufacturing a high-frequency module 30A which is characterized in that a sub-member 70 is used in a molding process of a resin package 35. FIG. 8 shows a high-frequency circuit board 32A in a state before being clamped in a mold 60A. FIG. 9 shows the high-frequency circuit board 32A in a state after being clamped in a mold 60A and also shows how the resin 66 is injected.

Figure 1A:
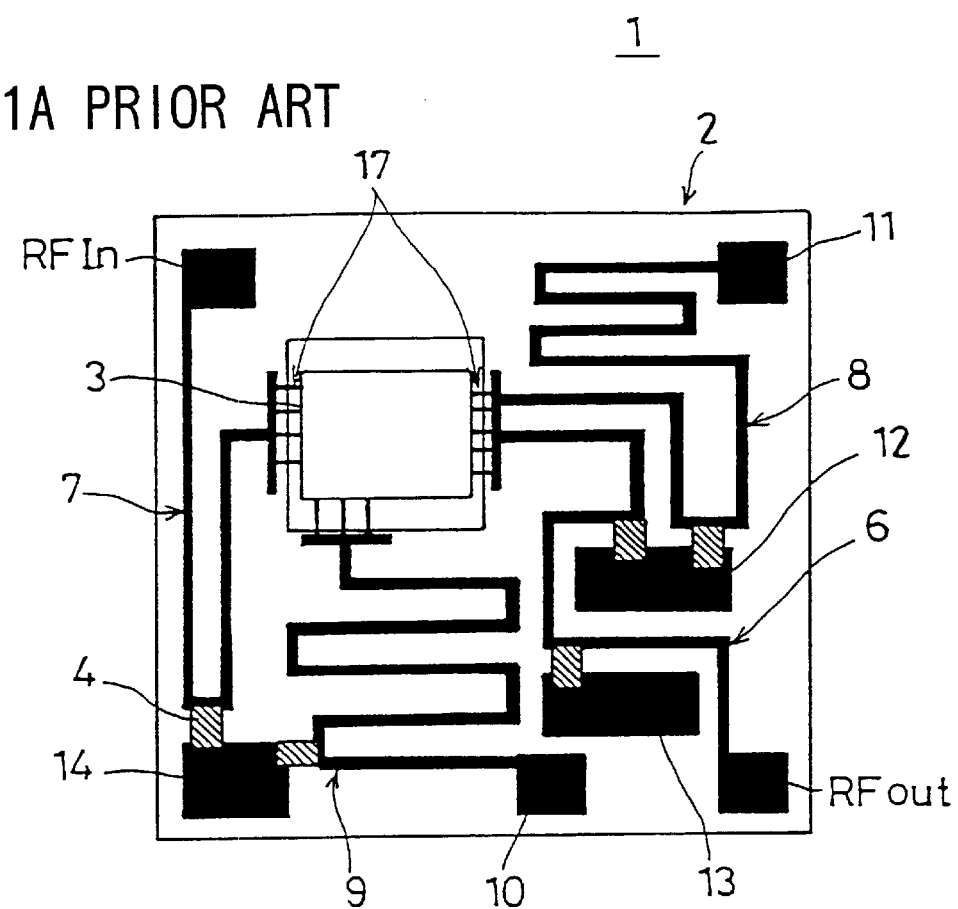
FIG. 1A and FIG. 1B are a plan view and a partial cross-sectional view, respectively, showing a high-frequency module of the related art.
Figure 1B:
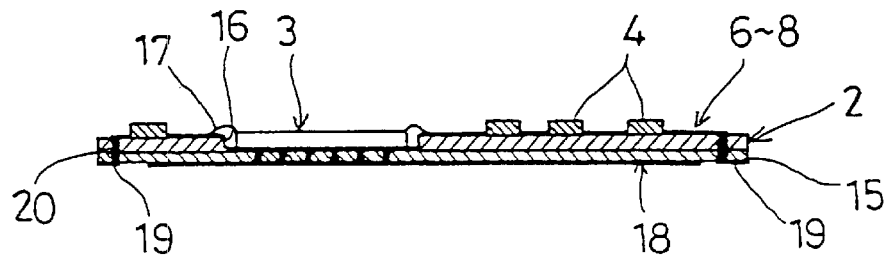
Figure 2:
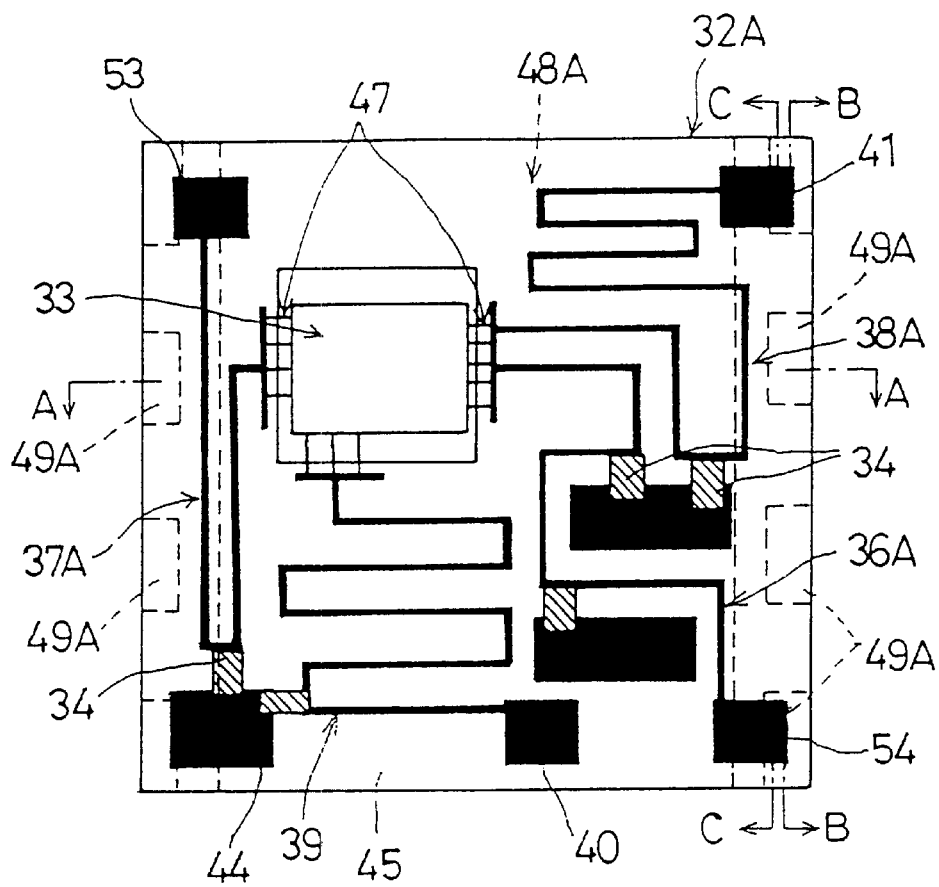
FIG. 2 is a plan view showing a high-frequency module which includes a thin-film resin substrate as its high-frequency circuit board.
Figure 3:
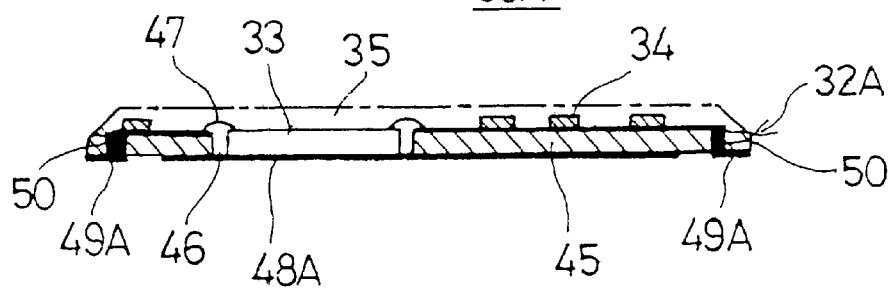
FIG. 3 is a partial cross-sectional diagram along line A—A of FIG. 2 viewed in the direction shown by the arrows.
Figure 4:
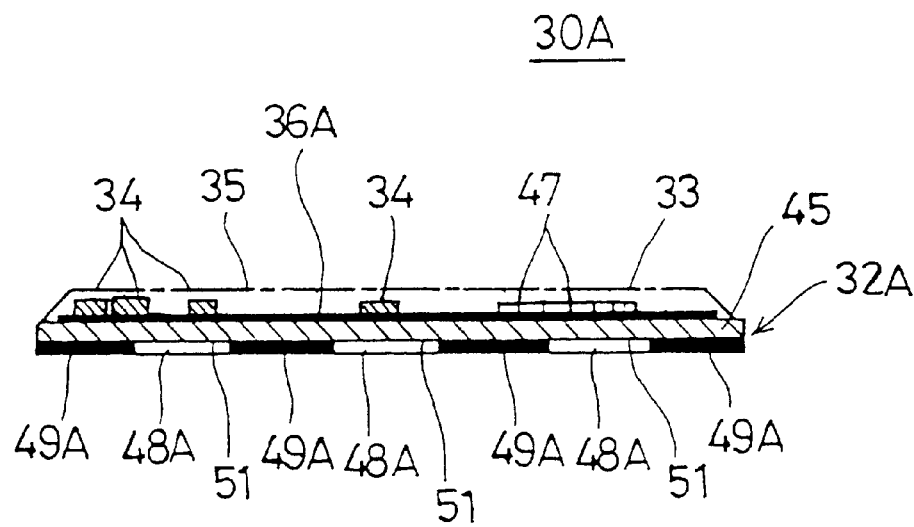
FIG. 4 is a partial cross-sectional diagram along line C—C of FIG. 2 viewed in the direction shown by the arrows.
Figure 5:
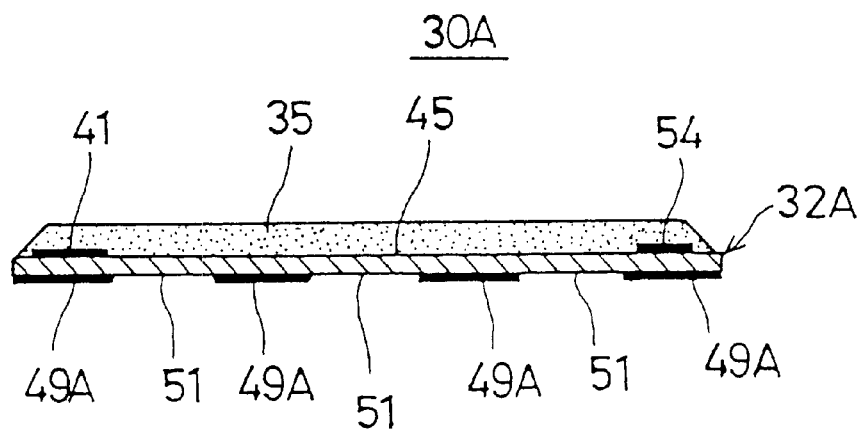
FIG. 5 is a cross-sectional diagram along line B—B of FIG. 2.
Figure 6:
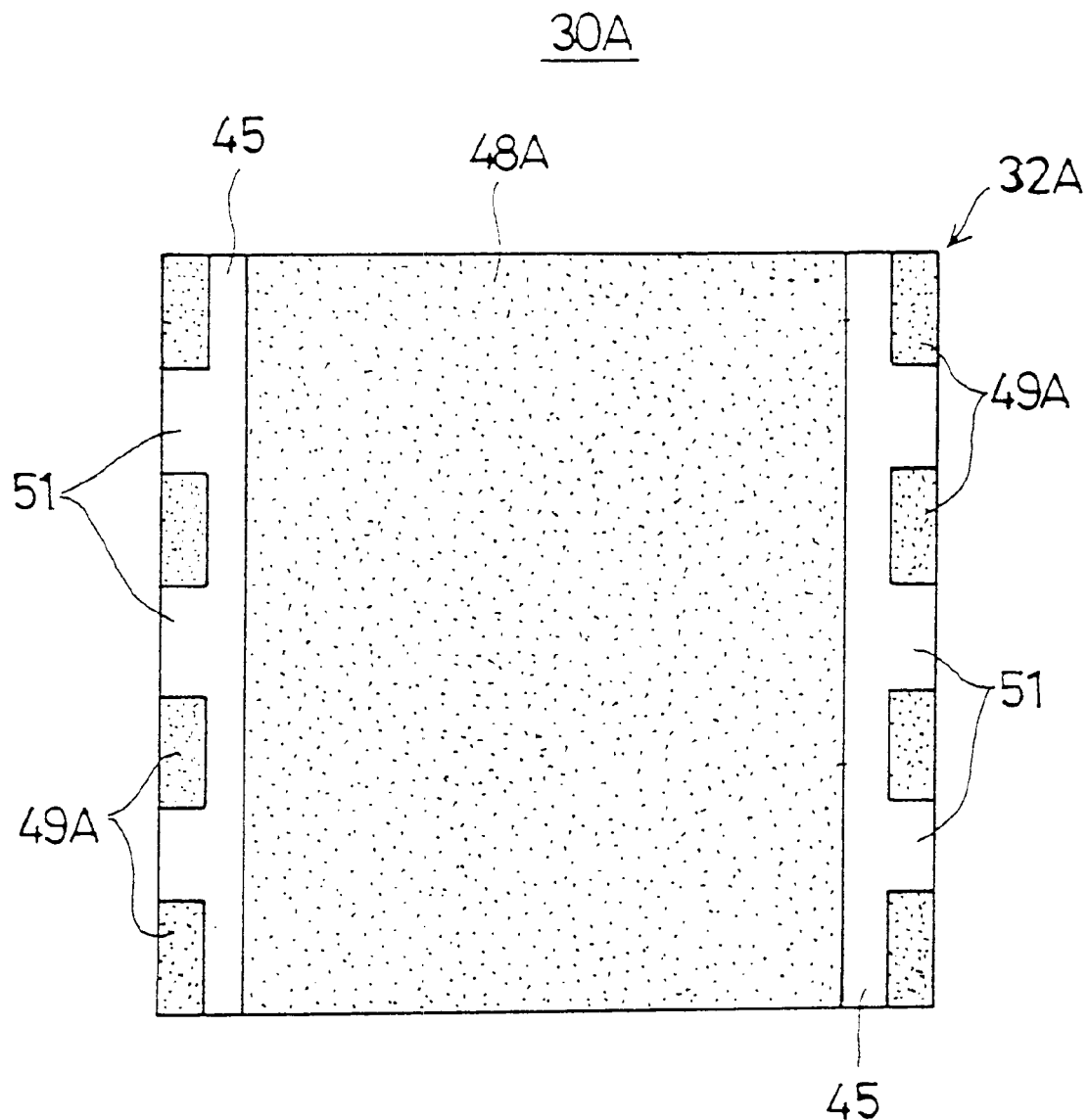
FIG. 6 is a bottom plan view of the high-frequency module shown in FIG. 2.
Figure 7:
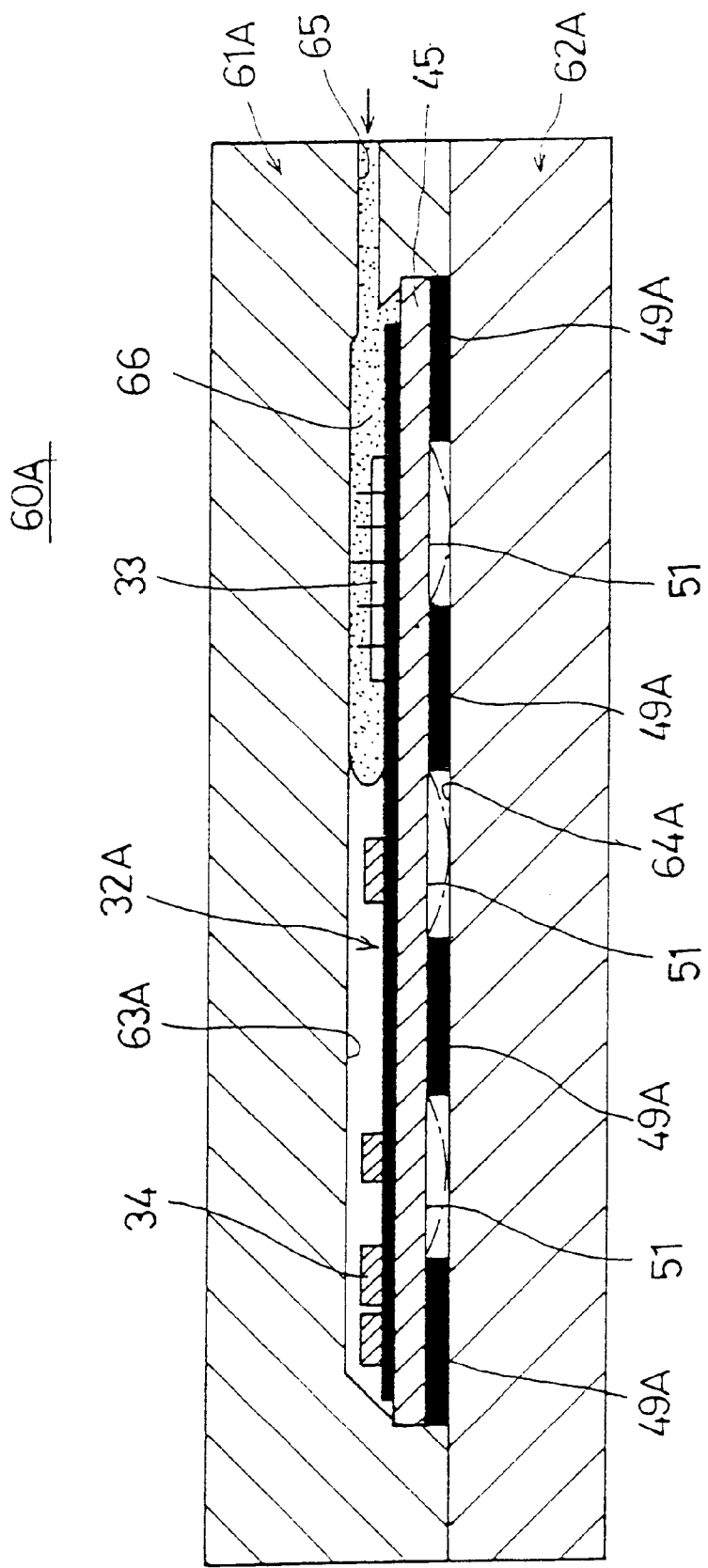
FIG. 7 is a diagram showing a resin molding step for forming a resin package of the high-frequency module shown FIG. 2.

In FIGS. 8 and 9, those elements that are similar to elements shown in FIG. 7 are indicated by similar reference numerals and will not be described in detail in the following description. Also, since the high-frequency circuit board 32A used in the present invention is identical to what is used for the high-frequency module 30A, no further detailed explanation is made for the high-frequency circuit-board 32A.

The sub-member 70 is made of a material such as a thermally resistive hard resin and is provided with raised parts 71 and recessed portions 72 on its surface facing towards the high-frequency circuit board 32A. The raised parts 71 and the recessed portions 72 are configured such that it forms a negative of (or has a reversed shape of) the configuration of the land portions 49A and the recessed portions 51 provided on the second surface of the high-frequency circuit board 32A.

In other words, when the high-frequency circuit board 32A and the sub-member 70 are placed opposite each other, the land portions 49A of the high-frequency circuit board 32A face the recessed portions 72 of the sub-member 70, and, the recessed portions 51 of the high-frequency circuit board 32A face the raised parts 71 of the sub-member 70. Also, the height of the raised parts 71 is made equal to the height of the land portions 49A.

In order to implement molding process using the sub-member 70 of the above structure, firstly, the sub-member 70 is joined with the high-frequency circuit board 32A. Thus, the land portions 49A of the high-frequency circuit board 32A engage with the recessed portions 72 of the sub-members 70, and, the recessed portions 51 of the high-frequency circuit board 32A engage with the raised parts 71 of the sub-members 70. In other words, the recessed portions 51 formed in the high-frequency circuit board 32A are filled with the sub-member 70.

Accordingly, when implementing a molding process as shown in FIG. 9, the recessed portions 51 are filled with the raised parts of the sub-member 70. There is no gap between the cavity 64A and the high-frequency circuit board 32A while injecting the resin 66. Therefore, even if the base material 45 is biased due to pressure exerted by the resin 66 during molding, the base material 45 is supported by the raised parts 71 of the sub-member 70 and its deformation will be restricted.

Thus, during a molding process, deformation of the high-frequency circuit board 32A can be restricted (or reduced). Therefore, it is possible to prevent the chip components 34 from falling off from the high-frequency circuit board 32A and the interconnections 36A, 37A, 38A, 39 from peeling off from the base material 45. Further, it is possible to prevent the interconnections 36A, 37A, 38A, 39 from being disconnected due to stress applied thereto.

Now, a second embodiment of the present invention will be described with reference to FIGS. 10 and 11.

In the first embodiment described above, the deformation of the high-frequency circuit board 32A during the molding process is restricted by supporting the base material 45 using the sub-member 70 having raised parts 71 that engage with the recessed portions 51 of the high-frequency circuit board 32A. Whereas in the present embodiment, in order to restrict (or reduce) the deformation of the high-frequency circuit board 32A, a further high-frequency circuit board 32A is used in place of the sub-member 70 of the first embodiment.

Figure 10:
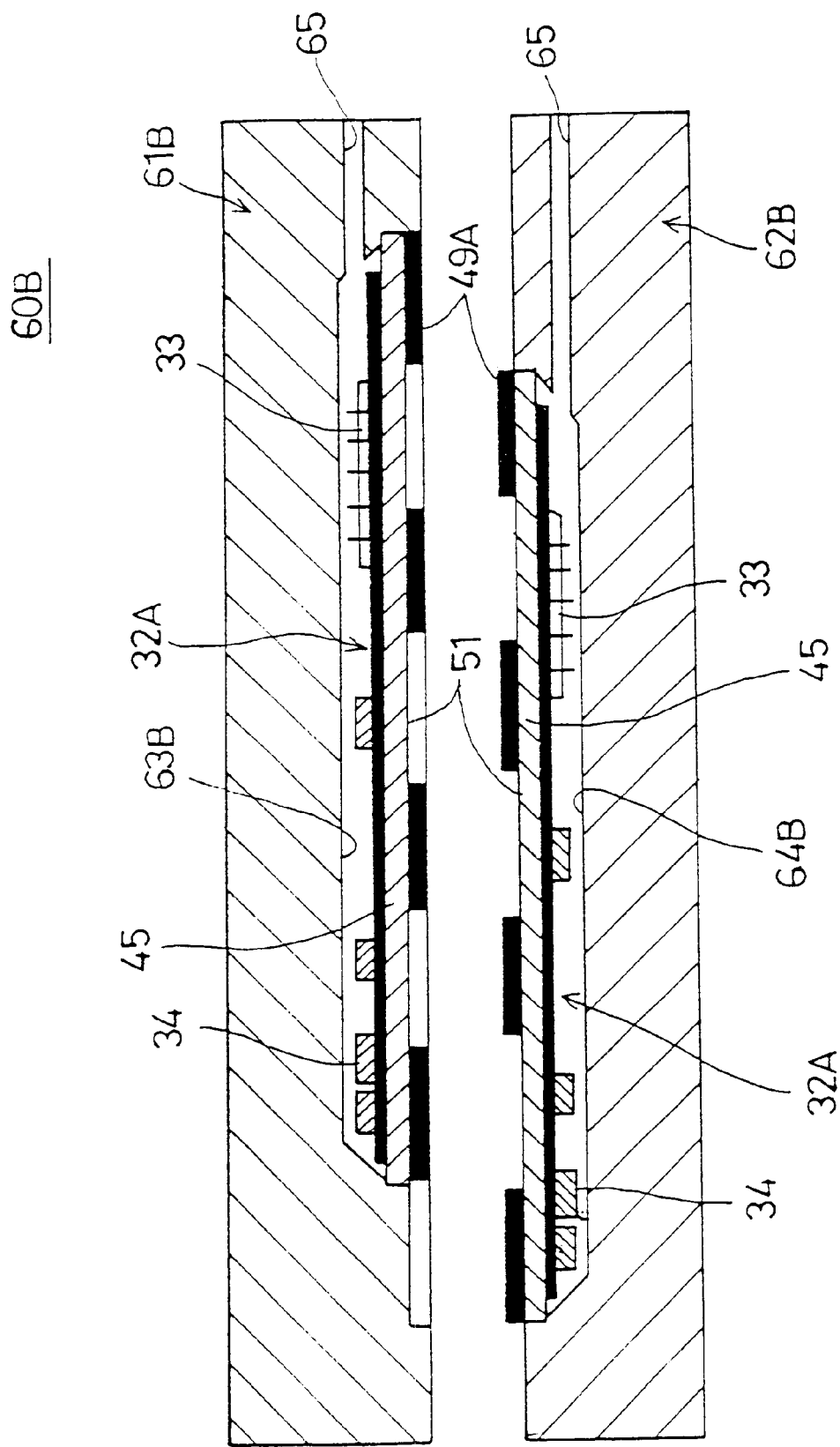
FIG. 10 is a schematic cross-sectional diagram of a second embodiment of the present invention showing how upper and lower molds are clamped in the resin molding step.

FIG. 10 shows a high-frequency circuit board 32A in a state before being clamped in a mold 60A. FIG. 11 shows the high-frequency circuit board 32A in a state after being clamped in a mold 60A and also shows how the resin 66 is injected. In FIGS. 10 and 11, those elements that are similar to elements shown in FIGS. 8 and 9 are indicated by similar reference numerals and will not be described in detail in the following description.

As has been described above, the second surface of the high-frequency circuit board 32A is unleveled since a plurality of land portions 49A are provided thereon. In the present embodiment, two high-frequency circuit boards 32A are situated such that the second surfaces thereof are opposing each other and offset by a distance corresponding to a pitch between neighboring land portions 49A. Thus, the land portions 49A of a first high-frequency circuit board 32A face with the recessed portions 51 of the second high-frequency circuit board 32A placed below the first high-frequency circuit board 32A. Similarly, the recessed portions 51 of the first high-frequency circuit board 32A face with the land portions 49A of a second high-frequency circuit board 32A.

In the present embodiment, a molding process is implemented as follows. Firstly, the high-frequency circuit boards 32A are placed in the mold 60B. The first high-frequency circuit board 32A is placed in the cavity 63B of the upper mold 61B and the second high-frequency circuit board 32A is placed in the cavity 64B of the lower mold 62B.

When placed in the mold 60B, the second surfaces of the high frequency circuit boards 32A are opposing each other and the high-frequency circuit boards 32A are offset by a distance corresponding to a pitch of the land portions 49A.

Then, the upper mold 61B and the lower mold 62 are joined together. The land portions 49A of the first high-frequency circuit board 32A placed in the upper mold 61B engages the recessed portions 51 of the second high-frequency circuit board 32A placed in the lower mold 62B. Similarly, the recessed portions 51 of the first high-frequency circuit board 32A placed in the upper mold 61B engages the land portions 49A of the second high-frequency circuit board 32A placed in the lower mold 62B. In other words, the recessed portions 51 of one of the first and second high-frequency circuit boards 32A are filled with the land portions 49A of another one of the first and second high-frequency circuit boards 32A.

Figure 11:
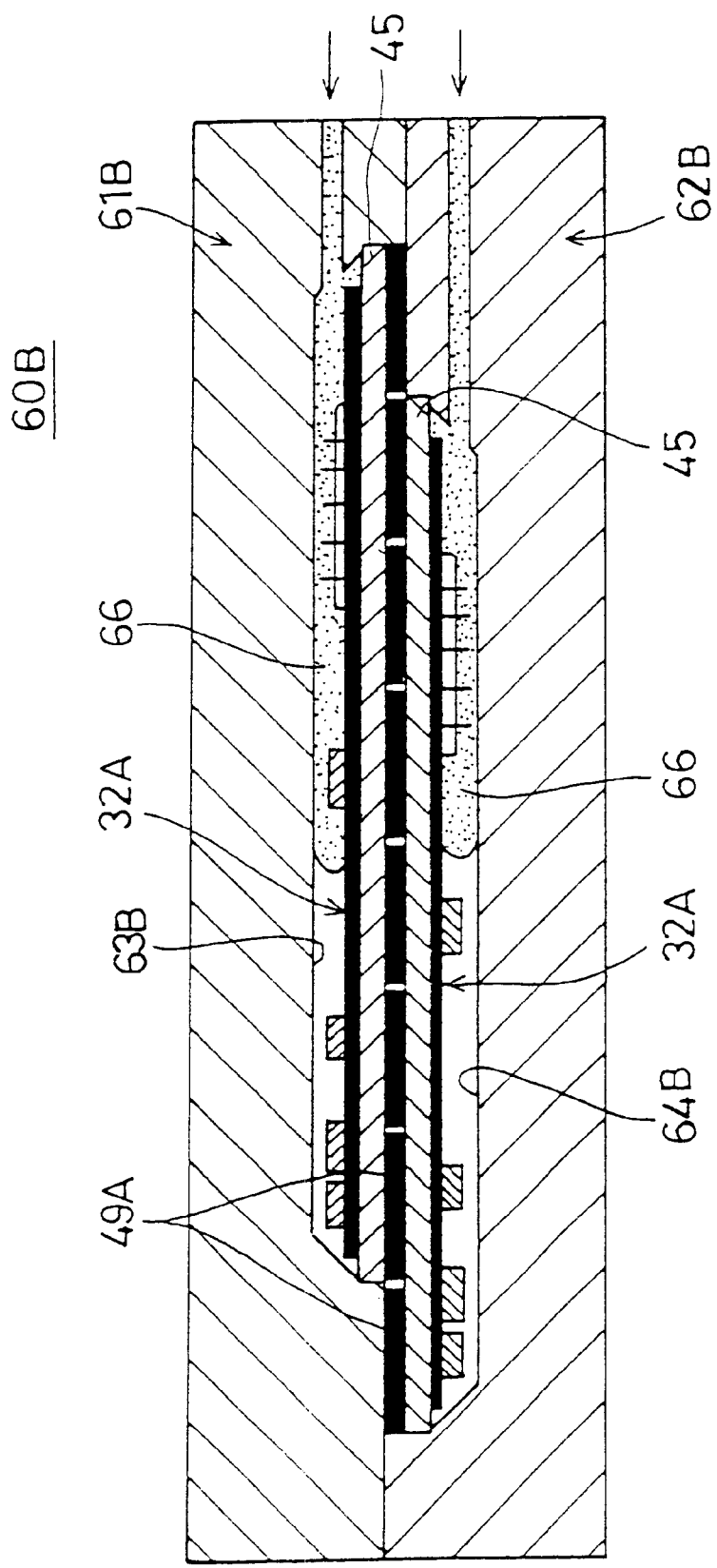
FIG. 11 is a schematic cross-sectional diagram of a second embodiment of the present invention showing how resin is injected the resin molding step.

As shown in FIG. 11, during a molding process, since the recessed portions 51 are filled with the land portions 49A of the opposing high-frequency circuit board 32A, the resin 66 is injected in a state where there is no space between a pair of high-frequency circuit board 32A.

Accordingly, during a molding step, even if the base materials 45 of the first and second high-frequency circuit boards 32A are biased due to a pressure exerted by the resin 66, a pair of high-frequency circuit boards 32A will mutually support the recessed portions 51. Thus, during a molding step, the deformation of each of the high-frequency circuit boards 32A can be restricted. Therefore, it is also possible in the present embodiment to prevent the chip components 34 from falling off from the high-frequency circuit board 32A and the interconnections 36A, 37A, 38A, 39 from peeling off from the base material 45. Further, it is possible to prevent the interconnections 36A, 37A, 38A, 39 from being disconnected due to stress applied thereto.

In the present embodiment, the sub-member 70 used in the first embodiment can be omitted. Therefore, there is no need to design and manufacture the sub-member 70 and the cost required for the molding process can be reduced.

In the molding process of the present embodiment, the ground layers 48A formed on the first and second high-frequency circuit boards 32A must also engage with each other. Accordingly, the ground layers 48A is configured to engage with each other when the first and second high-frequency circuit boards 32A are joined together.

Now, a third embodiment of the present invention will be described with reference to FIGS. 12 and 13.

In the first embodiment described above, the deformation of the high-frequency circuit board 32A during the molding process is restricted by supporting the base material 45 using the sub-member 70 of hard resin having raised parts 71 that engage with the recessed portions 51 of the high-frequency circuit board 32A. Whereas in the present embodiment, in order to restrict the deformation of the high-frequency circuit board 32A, an elastic sub-member 75 is used in place of the sub-member 70 of the first embodiment.

Figure 12:
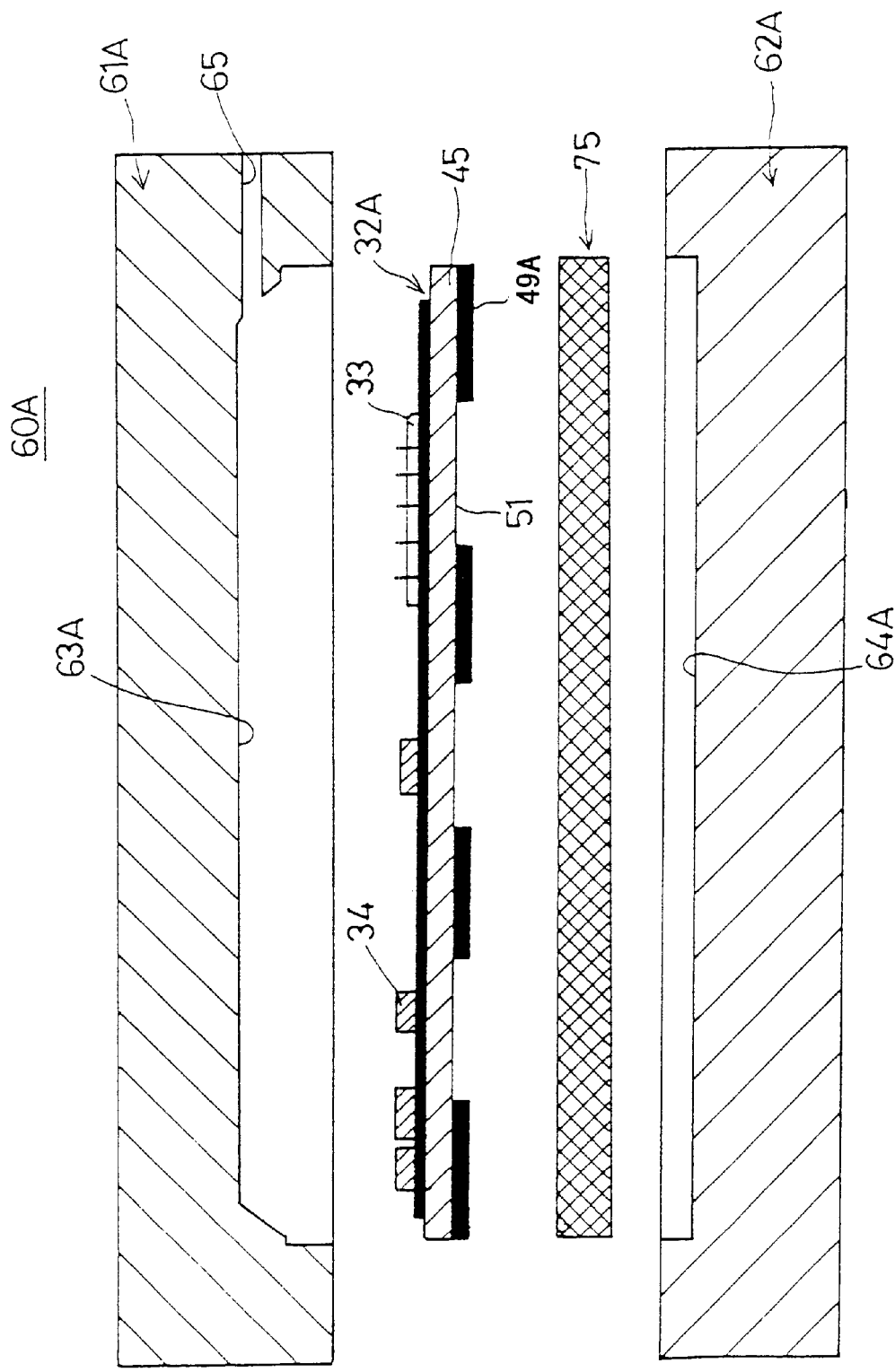
FIG. 12 is a schematic cross-sectional diagram of a third embodiment of the present invention showing how upper and lower molds are clamped in the resin molding step.

FIG. 12 shows a high-frequency circuit board 32A in a state before being clamped in a mold 60A. FIG. 13 shows the high-frequency circuit board 32A in a state after being clamped in a mold 60A and also shows how the resin 66 is injected. In FIGS. 12 and 14, those elements that are similar to elements shown in FIGS. 8 and 9 are indicated by similar reference numerals and will not be described in detail in the following description.

The elastic sub-member 75 is made of a resin material having an elastic property such as polyimide and is configured in a rectangular shape with no protruded parts nor recessed portions. When implementing a molding process using the elastic sub-member 75, the high-frequency circuit board 32A is placed in the cavity 63A of the upper mold 61A and the elastic sub-member 75 is placed in the cavity 64A of the lower mold 62A. Then, the upper mold 61A and the lower mold 62A are joined together.

Accordingly, the high-frequency circuit board 32A pressed the elastic sub-member 75. The elastic sub-member 75 elastically deforms into a shape corresponding to an unleveled profile (formed by the land portions 49A) of a second (lower) surface of the high-frequency circuit board 32A. Due to such elastic deformation, the elastic sub-member 75 enters the recessed portions 51.

Figure 13:
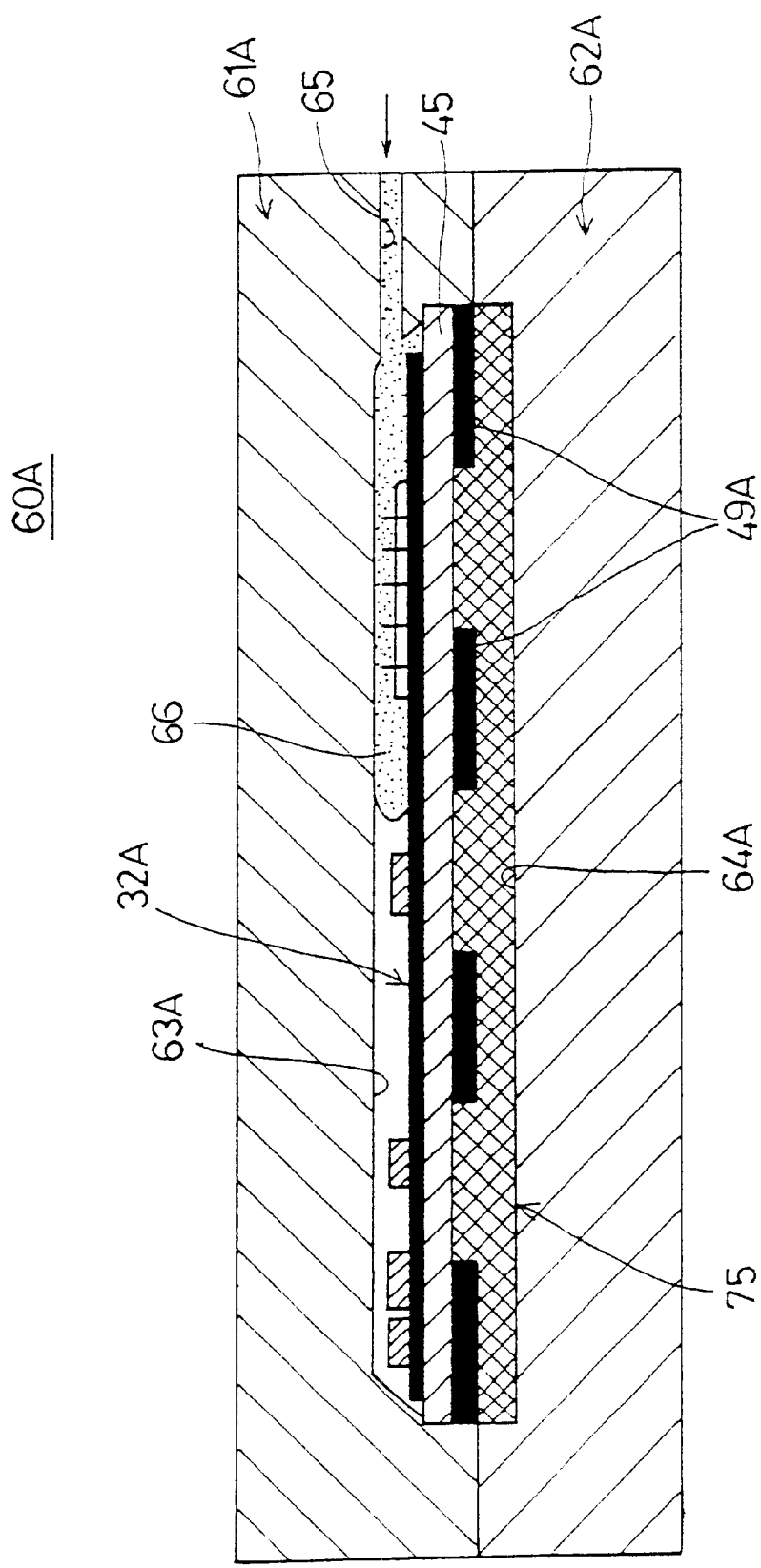
FIG. 13 is a schematic cross-sectional diagram of a third embodiment of the present invention showing how resin is injected in the resin molding step.
Figure 14:
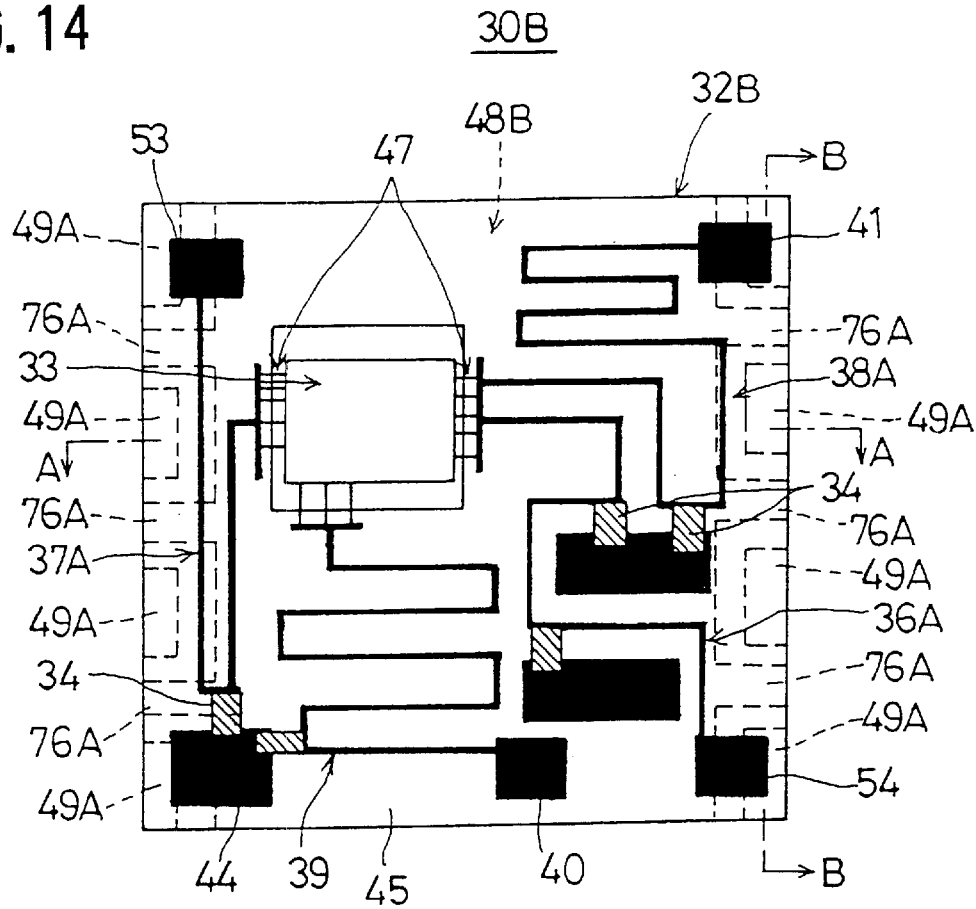
FIG. 14 is a plan view showing a high-frequency module of the fourth embodiment of the present invention.

As shown in FIG. 13, during a molding process, the recessed portions 51 are filled with the elastic sub-member 75, the resin 66 is injected in a state where there is no space between the cavity 64A and the high-frequency circuit board 32A.

Accordingly, during a molding step, even if the base materials 45 is biased due to a pressure exerted by the resin 66, the base material 45 is supported by the elastic sub-member 75 and its deformation is restricted.

Thus, during a molding step, the deformation of each of the high-frequency circuit boards 32A can be restricted. Therefore, it is also possible in the present embodiment to prevent the chip components 34 from falling off from the high-frequency circuit board 32A and the interconnections 36A, 37A, 38A, 39 from peeling off from the base material 45. Further, it is possible to prevent the interconnections 36A, 37A, 38A, 39 from being disconnected due to stress applied thereto.

Also, in contrast to the sub-member 70, since the elastic sub-member 75 elastically deforms, only one elastic sub-member 75 is required for various thin-film resin substrate having different number of lands 49A or different pattern. In other words, with the sub-member 70 with protruded parts 71 and recessed portions 70 of the first embodiment, one wishes to implement the molding process for various high-frequency circuit board with different number of lands 49A or different pattern, various types of sub-members 70 must be prepared for various types of high-frequency circuit boards.

With the molding process of the present embodiment, there is no need to prepare different types of elastic sub-member. 75 for various types of the land portions 49A of the high-frequency circuit board 32A.

Accordingly, it is possible to reduce cost required for the molding process.

Also, in the present embodiment, the elastic sub-member 75 is provided as sheet member of polyimide resin.

Therefore, the same material is used for the elastic sub-member 75 and for the base material 45 of the high-frequency circuit board 32A. Accordingly, in the molding process performed under heated environment, any stress due to the difference of thermal expansion can be prevented from being produced between the base material 45 and the elastic sub-member 75.

Now, a fourth embodiment of the present invention will be described with reference to FIGS. 14 through 18.

In each of the embodiments described above, the deformation of the high-frequency circuit board 32A during the molding process is restricted by supporting the recessed portions 51 of the base material 45 using the sub-member 70 or the elastic sub-member 75. Whereas in the present embodiment, in order to restrict the deformation of the high-frequency circuit board 32A, the recessed portions 51 are reinforced so as to improve the structure of the high-frequency module.

Figure 15:
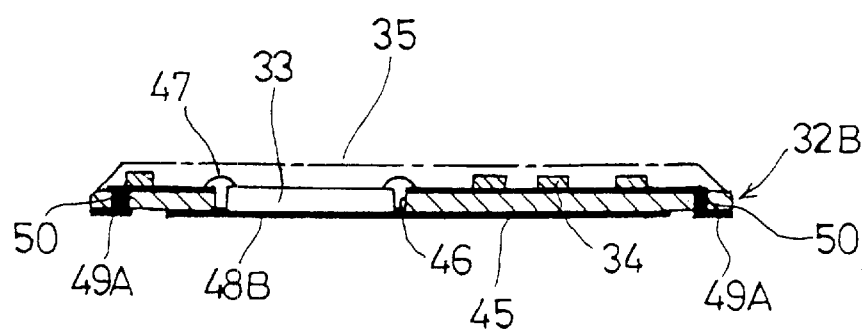
FIG. 15 is a partial cross-sectional diagram along line A—A of FIG. 14 viewed in the direction shown by the arrows.
Figure 16:
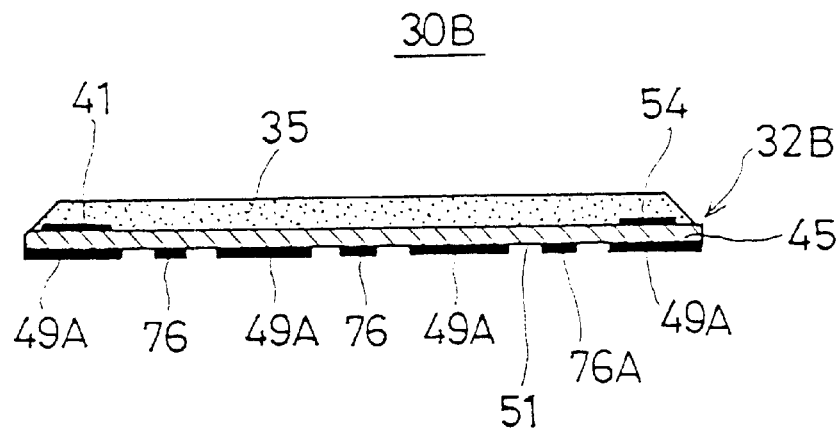
FIG. 16 is a cross-sectional diagram along line B—B of FIG. 14.
Figure 17:
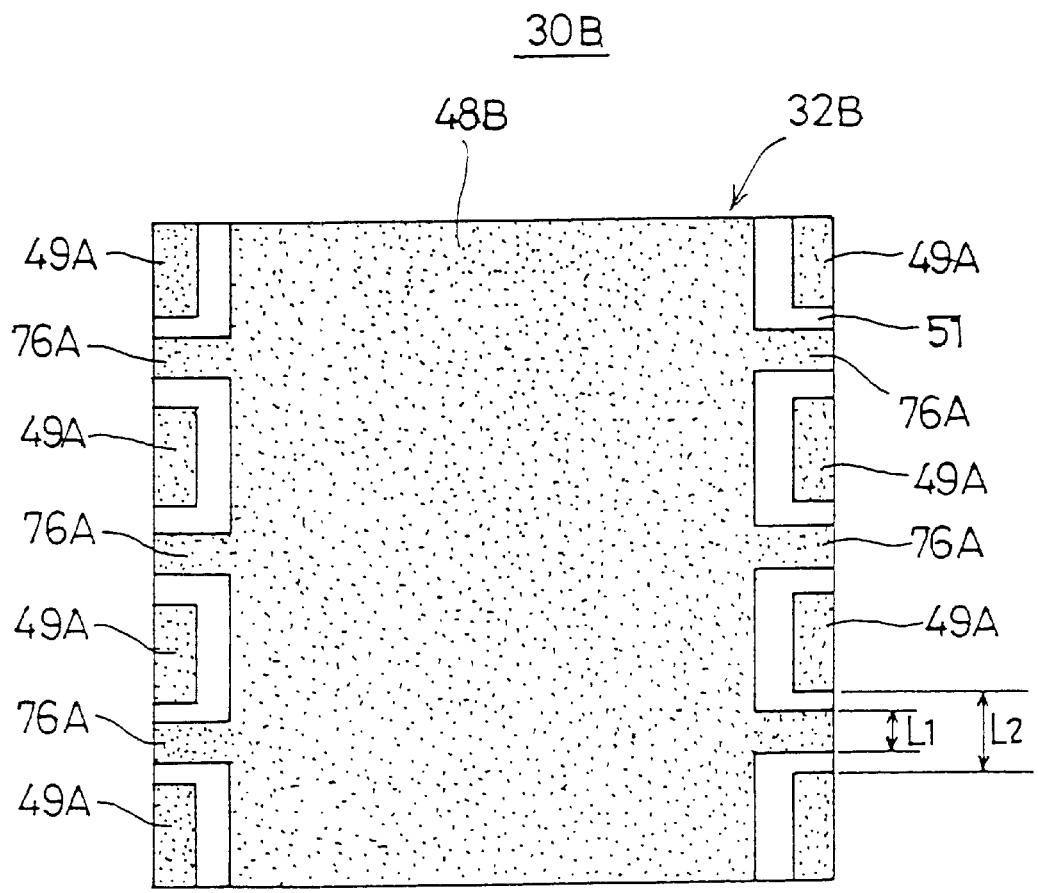
FIG. 17 is a bottom plan view of the high-frequency module shown in FIG. 14.

FIG. 14 is a plan view of the high-frequency module 30B of the present embodiment. FIG. 15 is a partial cross-sectional diagram along line A—A of FIG. 14. FIG. 16 is a partial cross-sectional diagram along line B—B of FIG. 14. FIG. 17 is a bottom view of the high-frequency module 30B. Further, FIG. 18 the high-frequency circuit board 32B in a state after being clamped in a mold 60A and also shows how the resin 66 is injected. In FIGS. 14 to 18, those elements that are similar to elements shown in FIGS. 2 to 6, 8 and 9 are indicated by similar reference numerals and will not be described in detail in the following description.

As has been described above with reference to FIG. 7, during the molding process, the base material 45 is deformed at positions of the recessed portions 51 where the base material 45 is exposed between neighboring land portions 49A. Thus, by mechanically reinforcing the recessed portions 51, the deformation of the base material 45 can be reduced.

In the present embodiment, supporting parts 76A are formed in the recessed portions 51 of the high-frequency circuit board 32B constituting the high-frequency module 30B. As shown in FIG. 17, the supporting parts 76A are formed integral with the ground layer 48A. As shown in FIG. 16, the thickness of the supporting parts 76A and the thickness of the land portions 49A are equal. When the width L2 of the recessed part 51 is, for example, 600 $\mu$m, the width L1 of the supporting part 76A is preferably 100 $\mu$m $\leq$ L1 $\leq$ 300 $\mu$m.

In the manufacturing process of the high-frequency module 30B of the above-described structure, the supporting parts 76A are formed before forming the resin package 35. As has been described above, since the supporting parts 76A are formed integral with the ground layer 48A, the ground layer 48B and the land portions 49A may be formed simultaneously. Accordingly, even if the supporting parts 76A are provided, the manufacturing process of the high-frequency module 30B will not become complicated. Also, the manufacturing process can be simplified in comparison to a method in which the supporting parts 76A are formed in a forming process that is separate from the process of forming the ground layer 48A and the land portions 49A.

Figure 18:
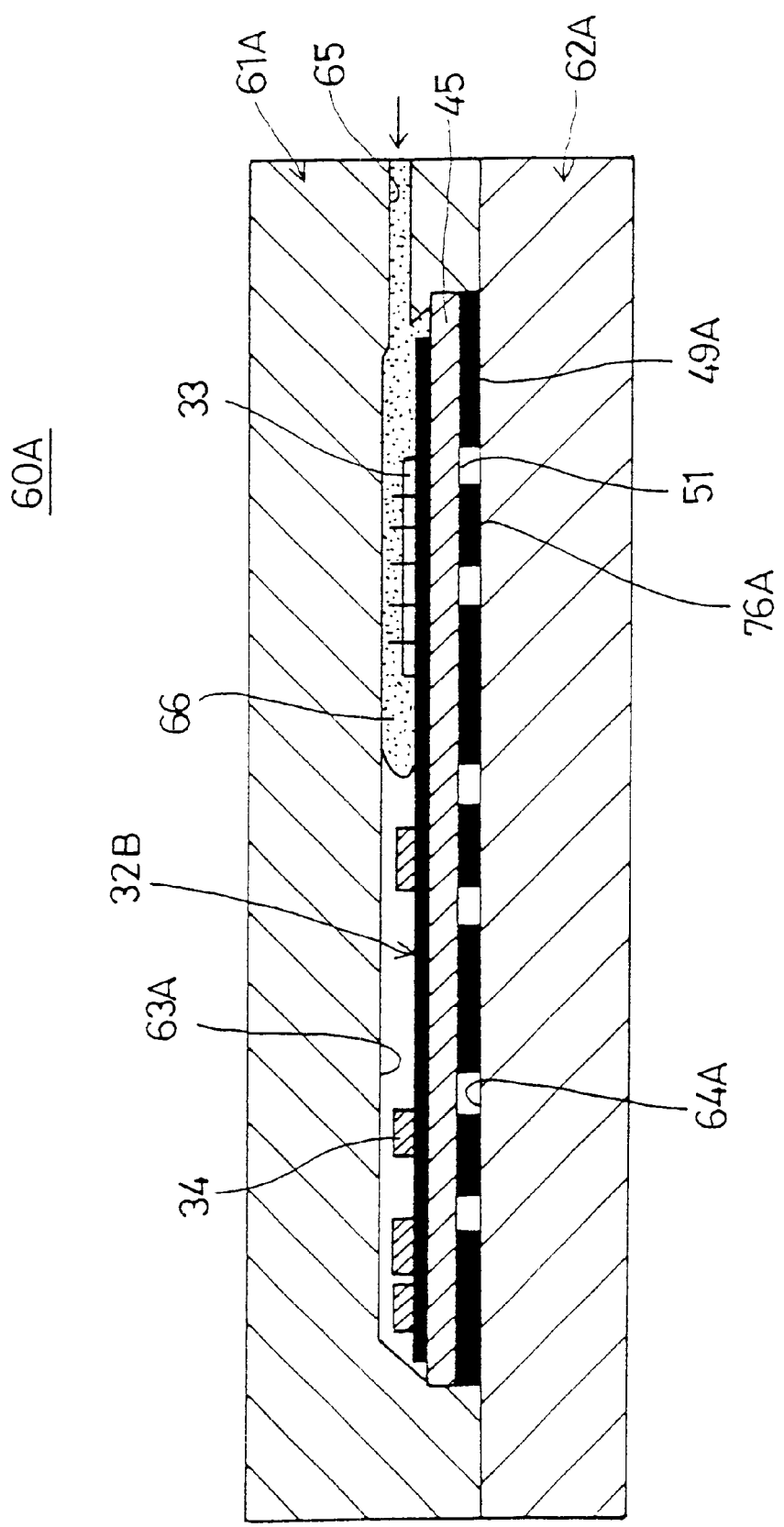
FIG. 18 is a schematic cross-sectional diagram of a fourth embodiment of the present invention showing how resin is injected in the resin molding step.

In the molding process, as shown in FIG. 18, the high-frequency circuit board 32B provided with the supporting parts 76A is placed in the mold 60A and then the resin 66 is injected. When the high-frequency circuit board 32B is placed in the mold 60A, the land portions 49 touches the cavity 64 of the lower mold 62A. In this state, the supporting parts 76A having the same height as the land portions 49A also touches the cavity 64. Accordingly, the recessed portions 51 of the high-frequency circuit board 32A are supported by the supporting parts 76A.

Thus, even if the base materials 45 is biased due to a pressure exerted by the resin 66 during the molding step, the base material 45 is supported by the supporting parts 76A and its deformation is restricted. Thus, deformation of the high-frequency circuit board 32A can also be restricted with the molding process of the present embodiment. Therefore, it is possible to prevent the chip components 34 from falling off from the high-frequency circuit board 32B and the interconnections 36A, 37A, 38A, 39 from peeling off from the base material 45. Further, it is possible to prevent the interconnections 36A, 37A, 38A, 39 from being disconnected due to stress applied thereto.

Accordingly, since the deformation of the high-frequency circuit board 32B is restricted, the high-frequency module 30B that is manufactured with the manufacturing process described above can be mounted to a mounting board with an improved mounting ability. When the high-frequency module 30B is mounted on the mounting board, the land portions 49A for providing electrical connection touches the mounting board, and the supporting portions 76A also touches the mounting board. Therefore, the high-frequency module 30B of the present embodiment can be mounted on the mounting board with a high stability. Accordingly, the land portions 49A and the mounting board can be soldered with an improved soldering ability.

Further, as shown in FIG. 17, supporting parts 76A are positioned between neighboring land portions 49A. Also, the supporting parts 76A are formed integral with the ground layer 48B that is grounded. Thus, since a pair of neighboring land portions 49A is electro-magnetically separated from the supporting part 76A, the land portions 49A can be securely isolated from one another.

Figure 19:
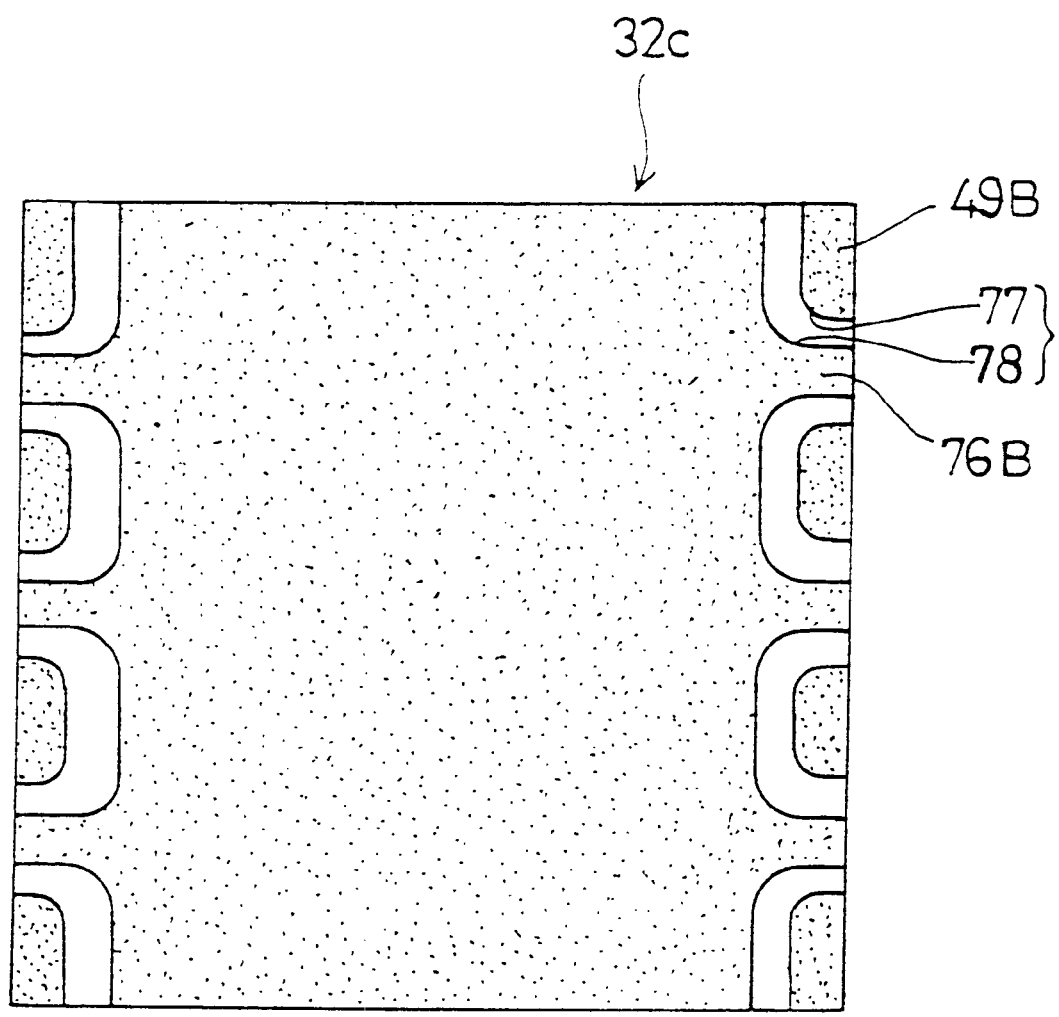
FIG. 19 is a bottom plan view of the high-frequency module of a variant of the fourth embodiment of the present invention.

Accordingly, with the high-frequency module 30B of the present embodiment, it is possible to reduce the interference between the land portions 49A through which the high-frequency signals are input/output. As shown in FIG. 19 for the high-frequency circuit board 32V, curved parts 77, 78 are formed at corners of the land portions 49B and the supporting parts 76B. Thus, it is possible to further reduce the interference between the land portions 49B.

Figure 21:
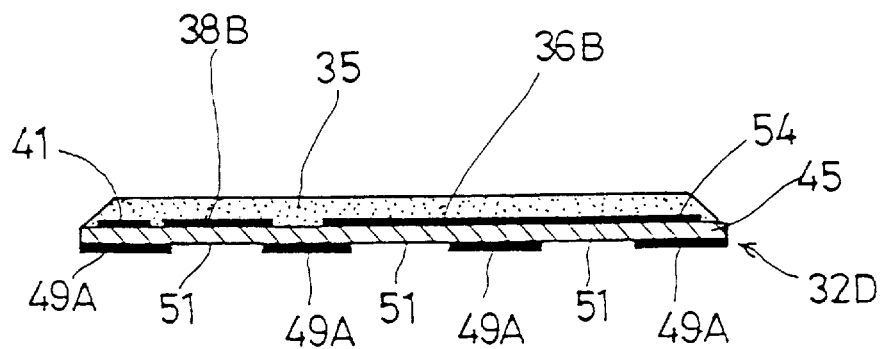
FIG. 21 is a cross-sectional diagram along line B—B of FIG. 20.
Figure 22:
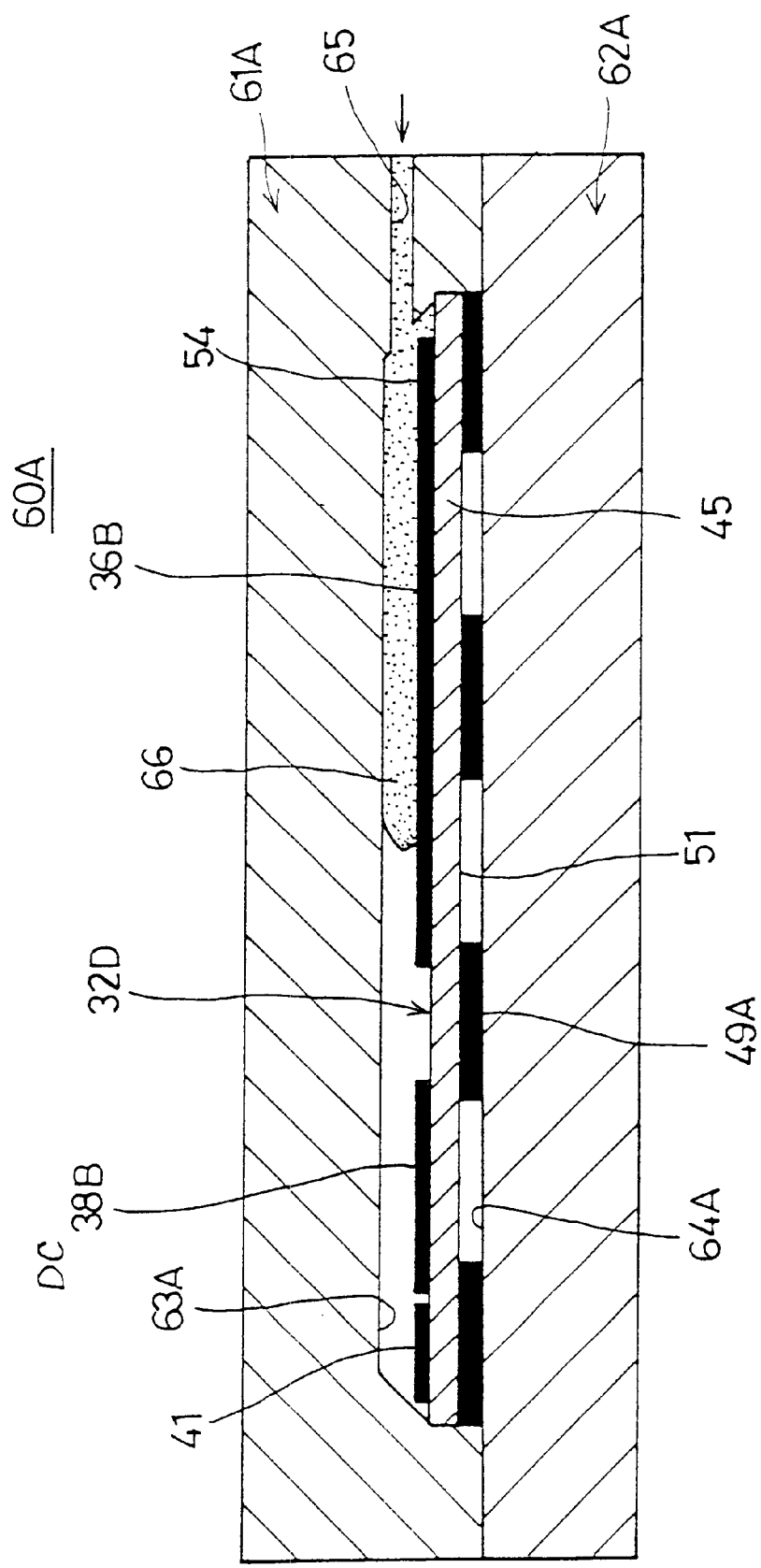
FIG. 22 is a schematic cross-sectional diagram of a fifth embodiment of the present invention showing how resin is injected in the resin molding step.

Now, a fifth embodiment of the present invention will be described with reference to FIGS. 20 through 22.

This embodiment is also characterized in that the recessed portions 51 are reinforced by adding improved feature to the structure of the high-frequency module. Accordingly, the deformation of the high-frequency circuit board 32D is reduced.

Figure 20:
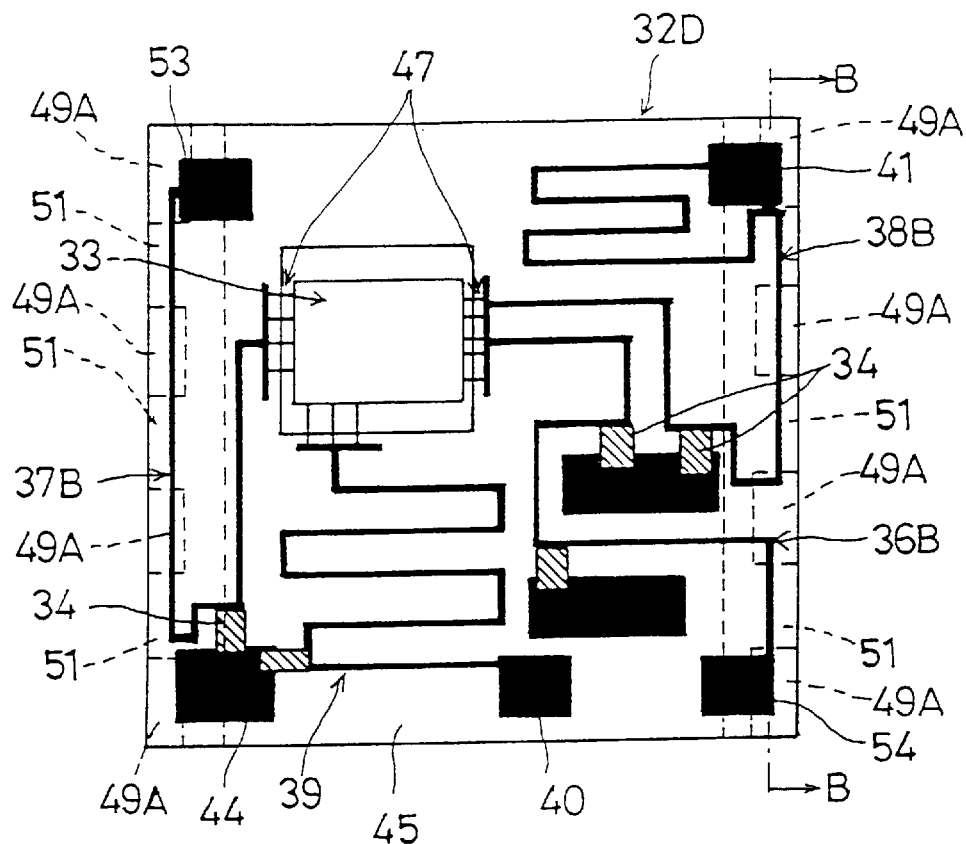
FIG. 20 is a plan view showing a high-frequency module of the fifth embodiment of the present invention.

FIG. 20 is a plan view of the high-frequency module 30C of the present embodiment. FIG. 21 is a partial cross-sectional diagram along line B—B of FIG. 20. FIG. 16 is a partial cross-sectional diagram along line B—B of FIG. 14. Further, FIG. 22 shows the high-frequency circuit board 32D in a state after being clamped in a mold 60A and also shows how the resin 66 is injected. In FIGS. 20 to 22, those elements that are similar to elements shown in FIGS. 2 to 6, 8 and 9 are indicated by similar reference numerals and will not be described in detail in the following description.

In the fourth embodiment described above, the deformation of the high-frequency circuit boards 32B, 32C is restricted by providing the supporting parts 76A and 76B in the recessed portions 51. Whereas in the present embodiment, in order to restrict or to reduce the deformation of the base material 45, the recessed portions 51 are mechanically reinforced using various interconnections provided on the high-frequency module 30C.

In detail, in the present embodiment, the positions of the high-frequency circuit interconnections 36B, 37B and the DC circuit interconnection 38B are altered such that they are provided on the base material 45 at positions opposing the recessed portions 51. Accordingly, as shown in FIG. 21, the high-frequency circuit interconnections 36B, 37B and the DC circuit interconnection 38B are provided above the recessed portions 51 with the base material 45 being interposed therebetween.

The high-frequency circuit interconnections 36B, 37B and the DC circuit interconnection 38B formed simultaneously with the DC circuit interconnection 39. Also, the positions of the interconnections 36A to 38B can be easily altered by altering the mask pattern used for forming the interconnections 36B to 38B and 39. Also, the thickness of each of the interconnections 36B to 38B is, for example, 35 μm.

In the manufacturing process of the high-frequency module 30C of the above structure, the interconnections 36B—38B and 39B are formed before forming the resin package 35. In the molding process, as shown in FIG. 22, the high-frequency circuit board 32D provided with the interconnections 36B to 38B is placed in the mold 60A and the resin 66 is injected.

When the high-frequency circuit board 32D is placed in the mold 60A, the land portions 49A touches the cavity 64A of the lower mold 62A. In this state, gaps are formed at positions corresponding to the recessed portions 51. However, as has been described above, the interconnections 36B to 38B are formed on the first surface of the base material 45 opposing the recessed portions 51. Accordingly, the mechanical strength at the recessed portions 51 is increased.

Therefore, even if the base material 45 is biased due to pressure exerted by the resin 66 during molding, the base material 45 is reinforced by the interconnections 36B to 38B and its deformation will be restricted.

Thus, during a molding process, deformation of the high-frequency circuit board 32D can be restricted. Therefore, it is also possible in the present embodiment to prevent the chip components 34 from falling off from the high-frequency circuit board 32A and the interconnections 36A, 37A, 38A, 39 from peeling off from the base material 45. Further, it is possible to prevent the interconnections 36A, 37A, 38A, 39 from being disconnected due to stress applied thereto.

Accordingly, since the deformation of the high-frequency circuit board 32D is restricted, the high-frequency module 30C of the present embodiment can be mounted on the mounting board with a high stability.

Now, a sixth embodiment of the present invention will be described with reference to FIGS. 23 through 27.

This embodiment is also characterized in that the mechanical strength at the recessed portions 51 is increased. Accordingly, the deformation of the high-frequency circuit board 32E is reduced.

Figure 23:
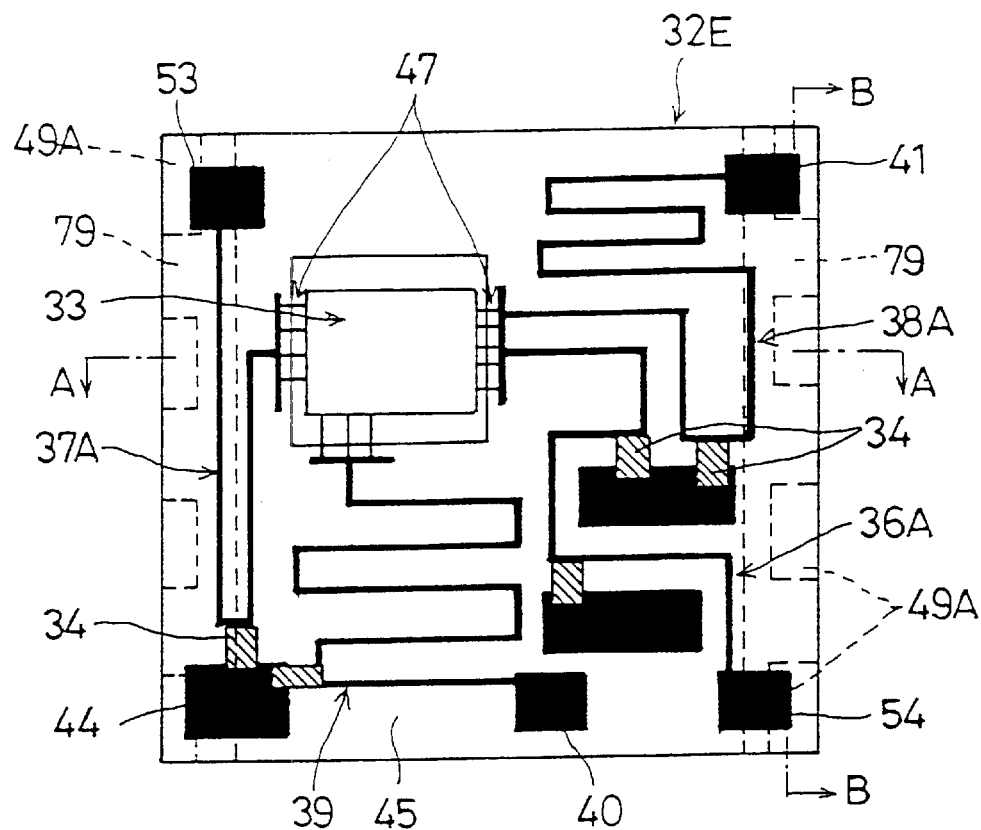
FIG. 23 is a plan view showing a high-frequency module of the sixth embodiment of the present invention.
Figure 24:
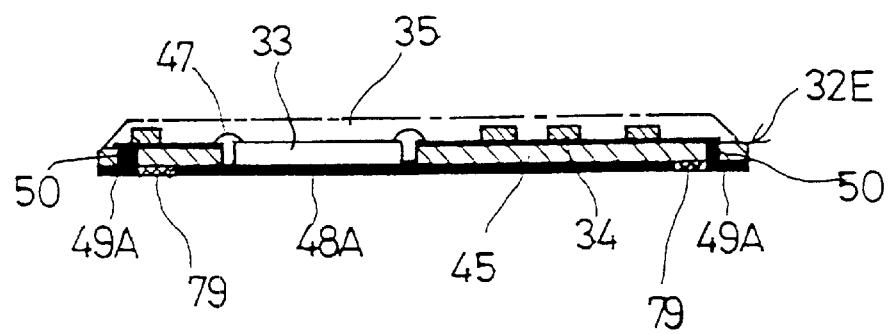
FIG. 24 is a partial cross-sectional diagram along line A—A of FIG. 23 viewed in the direction shown by the arrows.

FIG. 23 is a plan view of the high-frequency module 30D of the present embodiment. FIG. 24 is a partial cross-sectional diagram along line A—A of FIG. 23. FIG. 26 is a bottom plan view of the high-frequency module 30D. Further, FIG. 27 shows the high-frequency circuit board 32E in a state after being clamped in a mold 60A and also shows how the resin 66 is injected. In FIGS. 23 to 27, those elements that are similar to elements shown in FIGS. 2 to 6, 8 and 9 are indicated by similar reference numerals and will not be described in detail in the following description.

Figure 25:
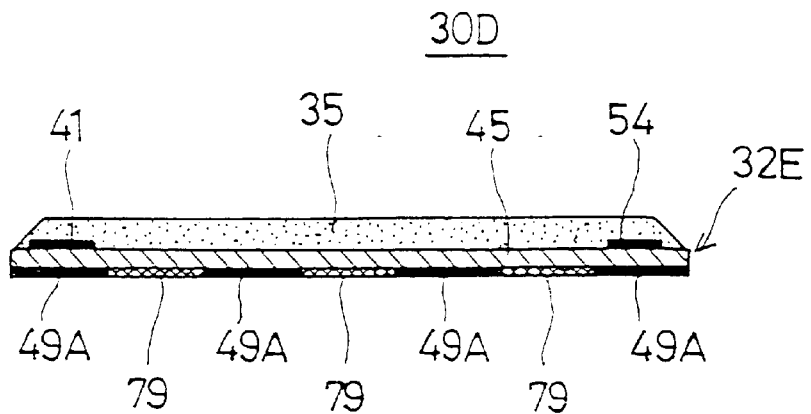
FIG. 25 is a cross-sectional diagram along line B—B of FIG. 23.
Figure 26:
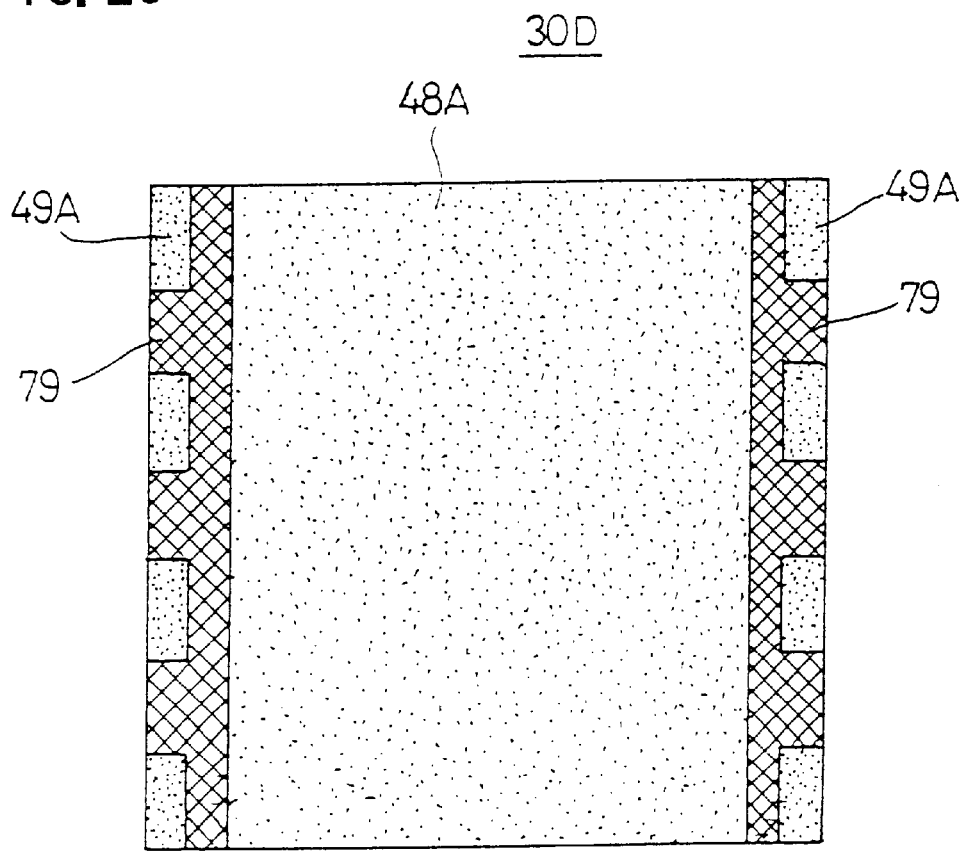
FIG. 26 is a bottom plan view of the high-frequency module shown in FIG. 23.
Figure 27:
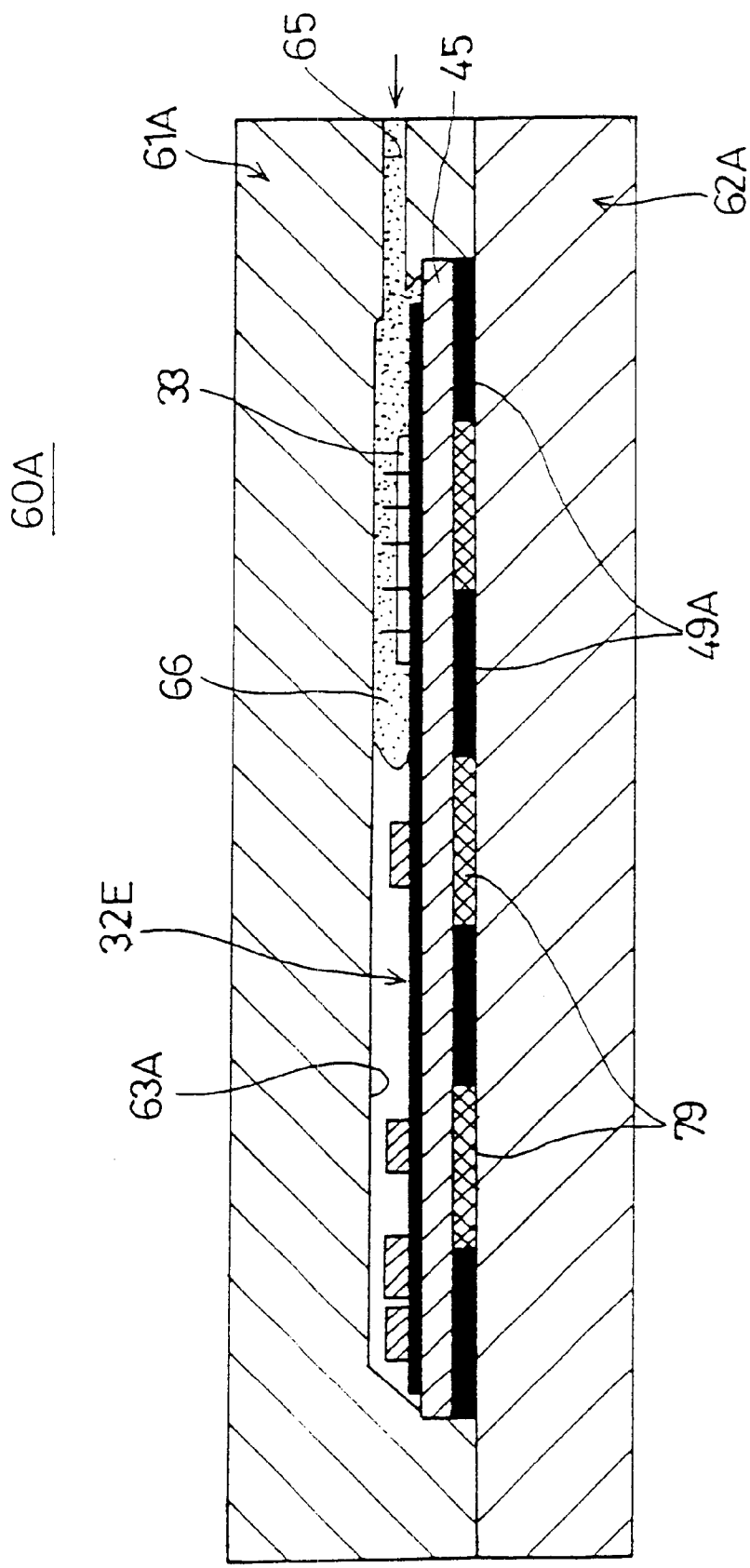
FIG. 27 is a schematic cross-sectional diagram of a sixth embodiment of the present invention showing how resin is injected in the resin molding step.

The present embodiment is characterized in that embedded members 79 are provided in the recessed portions 51 of the high-frequency circuit board 32E that is provided in the high-frequency module 30D (see FIGS. 25 and 26 for detailed illustration). The embedded member 79 is made of an insulating material such as a polyimide resin. In order to form the embedded members 79, the insulating material is heated until it becomes soft, and then the insulating material is filled in the recessed portions 51. Thus, the recessed portions 51 are filled with the embedded members 79 and the bottom surface of the high-frequency module 30D becomes flat.

In the manufacturing process of the high-frequency module 30D of the above-described structure, the embedded members 79 are formed before forming the resin package 35. Screen-printing may be used for providing the embedded members 79 so that the embedded members 79 can be easily provided in the recessed portions 51.

In the molding process, as shown in FIG. 27, the high-frequency circuit board 32E provided with the embedded members 79 in the recessed portions 51 is placed in the mold 60A and then the resin 66 is injected. When the high-frequency circuit board 32E is placed in the mold 60A, the land portions 49A touches the cavity 64A of the lower mold 62A. In this state, the embedded members 79 also touches the cavity 64A. Accordingly, the recessed portions 51 of the high-frequency circuit board 32E are supported by the embedded members 79.

Thus, even if the base materials 45 is biased due to a pressure exerted by the resin 66 during the molding step, the base material 45 is supported by the embedded members 79 and its deformation is restricted. Thus, deformation of the high-frequency circuit board 32E can also be restricted with the molding process of the present embodiment. Therefore, it is possible to prevent the chip components 34 from falling off from the high-frequency circuit board 32B and the interconnections 36A, 37A, 38A, 39 from peeling off from the base material 45. Further, it is possible to prevent the interconnections 36A, 37A, 38A, 39 from being disconnected due to stress applied thereto.

Accordingly, since the deformation of the high-frequency circuit board 32E is restricted, the high-frequency module 30D that is manufactured with the manufacturing process described above can be mounted to a mounting board with an improved mounting ability. When the high-frequency module 30D is mounted on the mounting board, the land portions 49A for providing electrical connection touches the mounting board, and the embedded members 79 also touches the mounting board. Therefore, the high-frequency module 30D of the present embodiment can be mounted on the mounting board with a high stability. Accordingly, the land portions 49A and the mounting board can be soldered with an improved soldering ability.

Further, as has been described above, the embedded members 79 are made of an insulating material and are provided in-the recessed portions 51 each positioned between neighboring land portions 49A. Thus, with the embedded members 79, the neighboring land portions 49A can be securely isolated. Accordingly, the interference may be reduced between the electrodes whereto and wherefrom the high-frequency signals are provided.

Also, after completing the molding process of the resin package 24, the embedded members 9 may be removed from the recessed portions 51. With this structure, since the land portions 49A will be protruded from the base material 45, the high-frequency module 30D may be connected to the mounting board with improved connecting ability.

Figure 29:
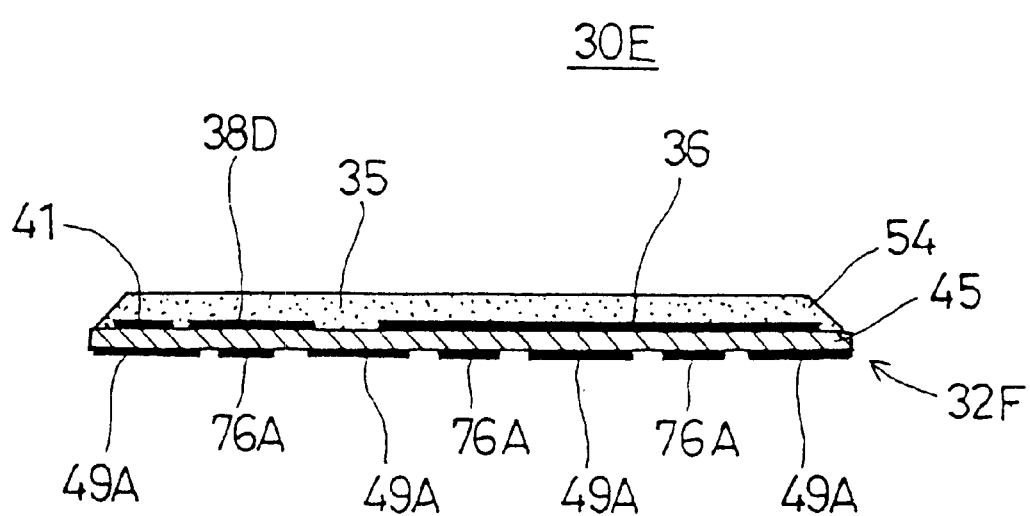
FIG. 29 is a cross-sectional diagram along line B—B of FIG. 28.
Figure 30:
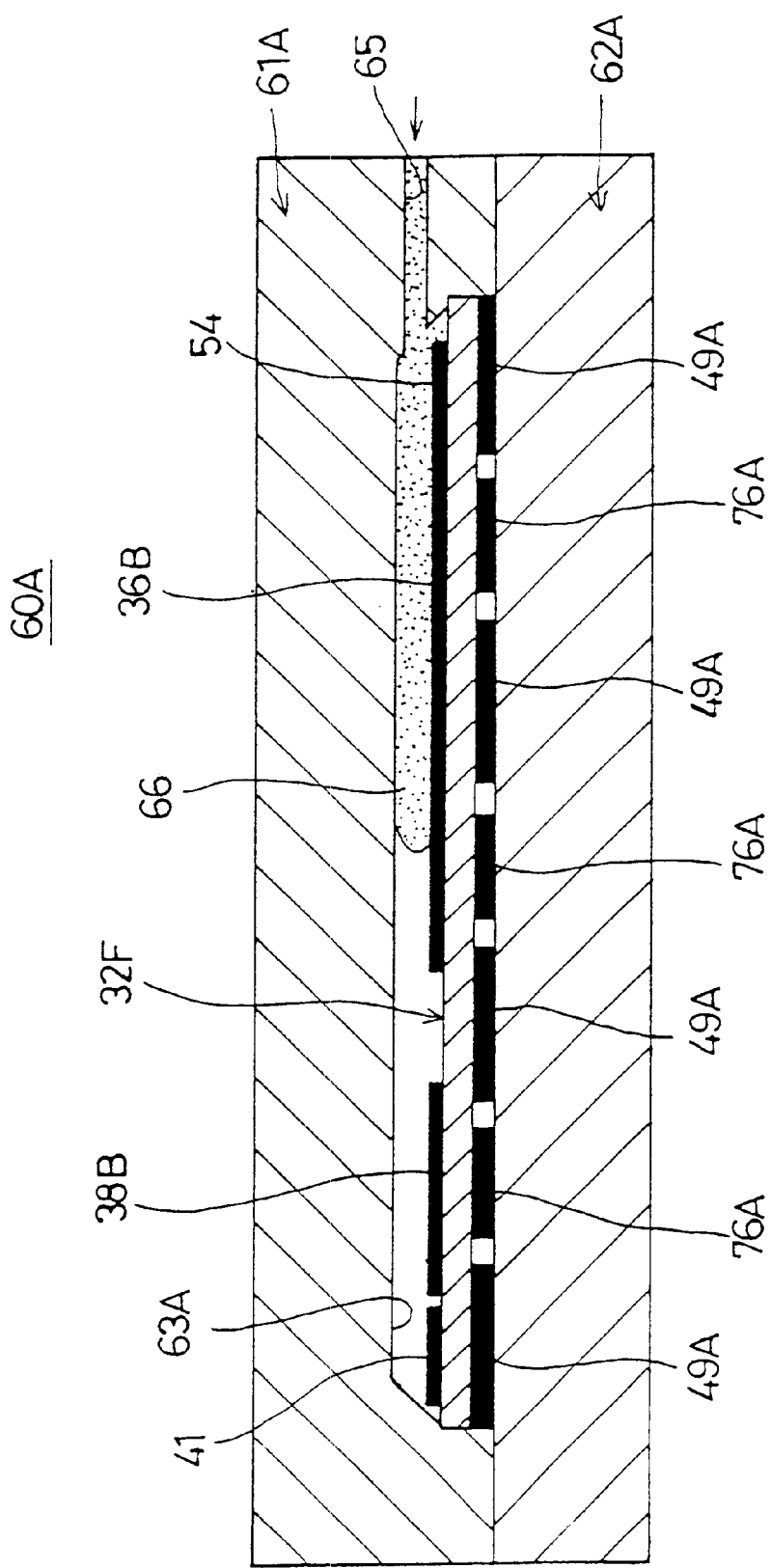
FIG. 30 is a schematic cross-sectional diagram of a seventh embodiment of the present invention showing how resin is injected step in the resin molding step.

Now, a seventh embodiment of the present invention will be described with reference to FIGS. 28 through 30.

Figure 28:
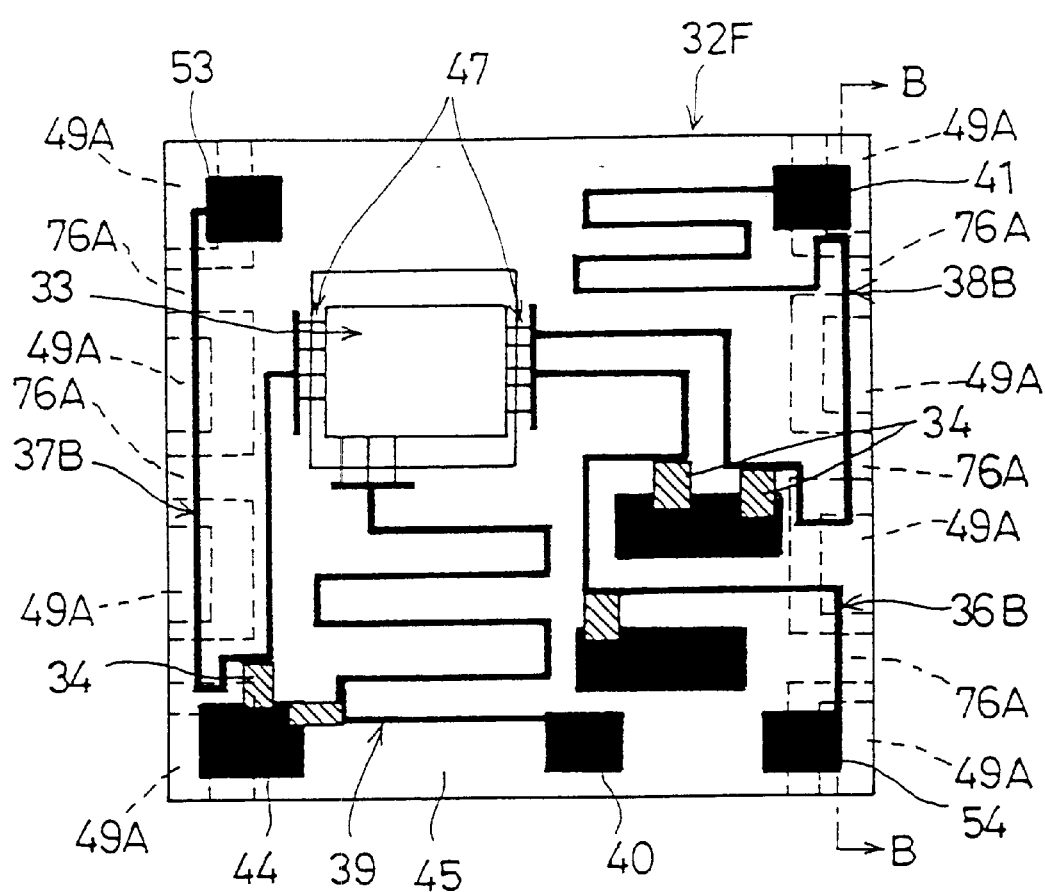
FIG. 28 is a plan view showing a high-frequency module of the seventh embodiment of the present invention.

FIG. 28 is a plan view of the high-frequency module 30E of the present embodiment. FIG. 29 is a partial cross-sectional diagram along line B—B of FIG. 29. FIG. 30 shows the high-frequency circuit board 32F in a state after being clamped in a mold 60A and also shows how the resin 66 is injected. In FIGS. 28 to 30, those elements that are similar to elements shown in FIGS. 2 to 6, 14 to 22 are indicated by similar reference numerals and will not be described in detail in the following description.

In the present embodiment, in a similar manner to the above-described fourth embodiment, the supporting parts 76A are formed in the recessed portions 51 of the high-frequency circuit board 32F (see FIGS. 14 to 18). Further, the present embodiment is characterized in that, in a similar manner to the above-described fifth embodiment, the high-frequency circuit interconnections 36B, 37B and the DC circuit interconnections 38B are provided on the first surface of the base material 45 facing the recessed portions 51 (see FIGS. 20 to 22).

With the structure of the present embodiment, the recessed portions 51 are reinforced by the embedded members 79A and by the high-frequency circuit interconnections 36B, 37B and the DC circuit interconnections 38B. As shown in FIG. 30, in the molding process for forming the resin package 35, the recessed portions 51 are supported by the supporting parts 76A and are also reinforced by the interconnections 36B, 37B and 38B. Therefore, even if the base material 45 is biased due to pressure exerted by the resin 66 during molding, the deformation of the base material 45 will be restricted.

Thus, during a molding step, the deformation of the high-frequency circuit board 32F can be restricted. Therefore, it is also possible in the present embodiment to prevent the chip components 34 from falling off from the high-frequency circuit board 32F and the interconnections 36B, 37B, 38B, 39 from peeling off from the base material 45. Further, it is possible to prevent the interconnections 36B, 37B, 38B, 39 from being disconnected due to stress applied thereto. Accordingly, since the deformation of the high-frequency circuit board 32F is restricted, the high-frequency module 30E that is manufactured with the manufacturing process described above can be mounted to a mounting board with an improved mounting ability.

Now, the supporting parts provided in the recessed portions 51 will be described in detail. In order to restrict the deformation of the high-frequency circuit board 32F (base material 45), it is preferable to provide the supporting parts 76A that extends across the entire surface of the recessed portions 51. However, as has been described above, the land portions 49A needs to be isolated from one another. Therefore, if the supporting parts 76A are made of, for example, a conductive material or a magnetic material and are provided across a great area in the recessed portions, the land portions 49A will not be sufficiently isolated between each other.

That is to say, when the supporting parts 76A are formed by the conductive material or the magnetic material, it is necessary to provide sufficient space within the recessed portions 51 to ensure isolation between the land portions 49A. The width of the space required is in an order of about 300 μm. Accordingly, with the structure provided with the supporting parts 76A in the recessed portions 51, the deformation of the base material 45 may not be restricted for some strength of a pressure exerted by the resin 66 during molding.

However, in the present embodiment, the high-frequency module 30E is provided with the supporting parts 76A and with the interconnections 36B, 37B, and 38B formed on the base material 45 opposing the recessed portions 51. Thus, even if the supporting parts 76A are formed in a shape that ensures that the land portions 49A are isolated from one another, the recessed portions 51 will be reinforced by the interconnections 36B, 37B and 38B. With such a structure, the deformation of the high-frequency circuit board 32F can be restricted while ensuring isolation between the land portions 49A.

Now, a seventh embodiment of the present invention will be described with reference to FIGS. 31 through 35.

In each of the embodiments described above, the land portions 49A are formed on the second surface of the base material 45, and then the resin package 35 is formed. Whereas in the present embodiment, the resin package 35 is formed before forming the land portions 49A.

With this method, since the resin package 35 is formed while there is no land portions 49A, there will be no unleveled portions formed on the second surface of the base material 45. Accordingly, the deformation of the base material 45 can be restricted. In the following description, a method of manufacturing the high-frequency module 30F of the present embodiment will be described in detail. In FIGS. 31 to 35, those elements that are similar to elements shown in FIGS. 2 to 6, 8 and 9 are indicated by similar reference numerals and will not be described in detail in the following description.

Figure 31A:
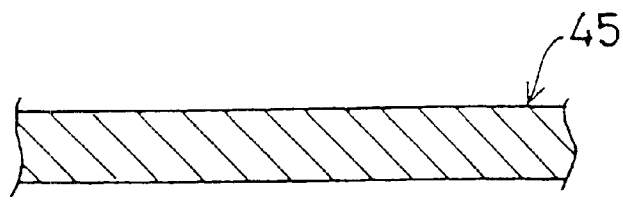
FIGS. 31A to 31D are schematic diagrams showing various steps of a manufacturing process high-frequency module of the seventh embodiment of the present invention.
Figure 31B:
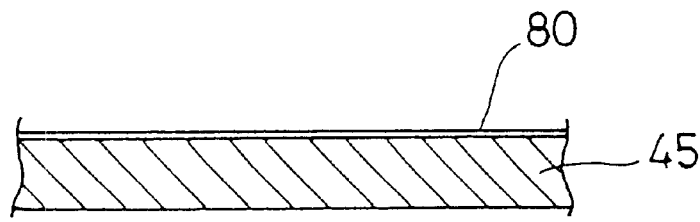

A method of manufacturing the resin package 35F is as follows. As shown in FIG. 31A, the base material 45 is prepared. The base material 45 is a polyimide film of a thickness of about 25 μm to 70 μm. As shown in FIG. 31B, a copper layer 80 is provided on a surface of the base material 45. In order to provide this copper layer 80, firstly, a thin layer of copper is formed by copper sputtering process and then a flush copper plating is implemented.

Figure 31C:
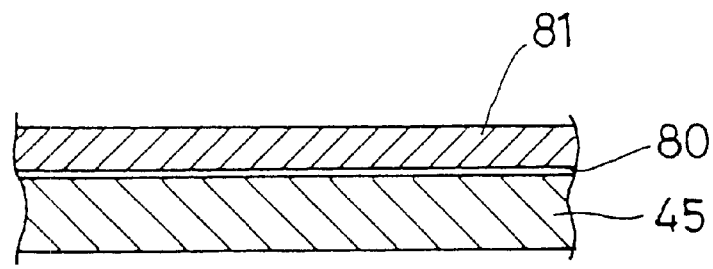

Then, as shown in FIG. 31C, a dry film 1 is provided over the copper layer 80. The dry film 81 is a photo-sensitive resin layer of a negative type.

Figure 31D:
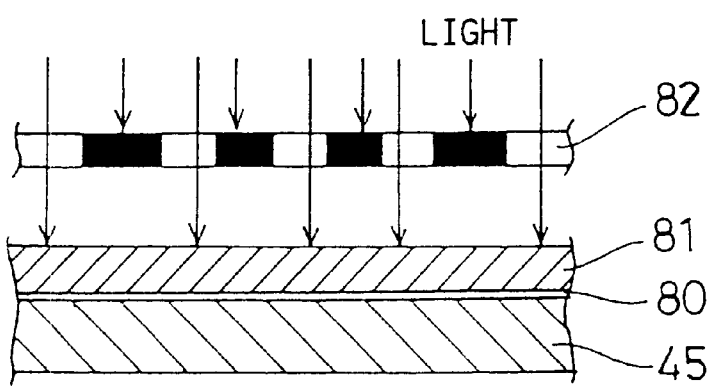

Then, the method proceeds to an exposure process. As shown in FIG. 31D, a glass mask 82 having a predetermined pattern is provided and a light (such as an ultra-violet ray) is illuminated thereto.

Figure 32A:
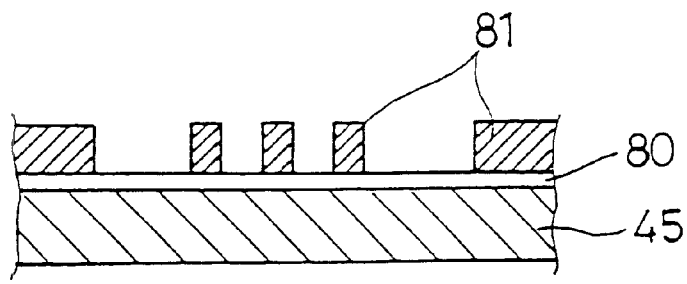
FIGS. 32A to 32E are schematic diagrams showing various steps subsequent to the steps shown in FIG. 31D.

Then, the method proceeds to a development process. Since the dry film 81 is a photo-sensitive resin layer of a negative type, the development process serves to leave only the portions of the dry film 81 that have been irradiated by light. FIG. 32A shows a state after the exposure process has been completed.

Figure 32B:
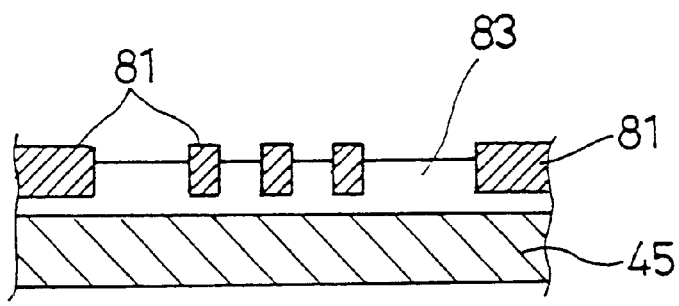

Then, the base material 45 is placed in an electrolytic plating vessel. Electrolytic plating process of copper is carried out using the copper layer 80 as electrodes. Accordingly, using the dry film 81 as a mask, a copper plating body 83 with a predetermined pattern is formed. FIG. 32B shows a state where the copper plating body 83 have been formed.

Figure 32C:
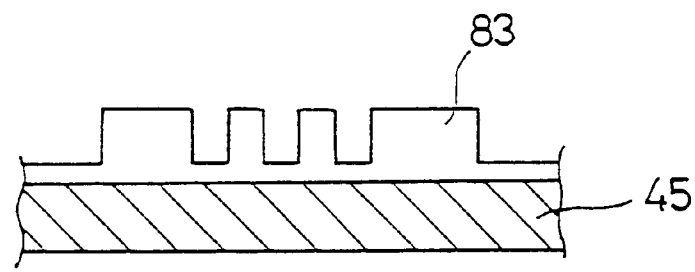
Figure 32D:
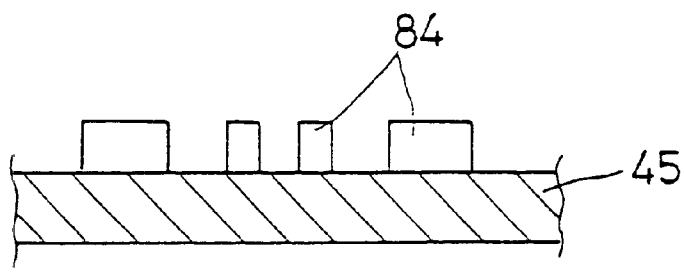

Then, as shown in FIG. 32C, the dry film 81 is removed. Subsequently, the copper plating body 83 is subjected to flush etching so as to form independent copper patterns 84. FIG. 32D shows a state where the copper patterns 84 have been formed.

Figure 32E:
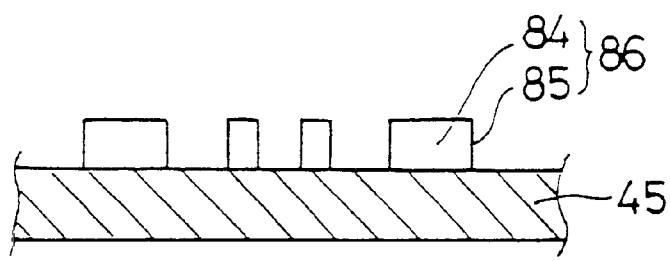
Figure 33A:
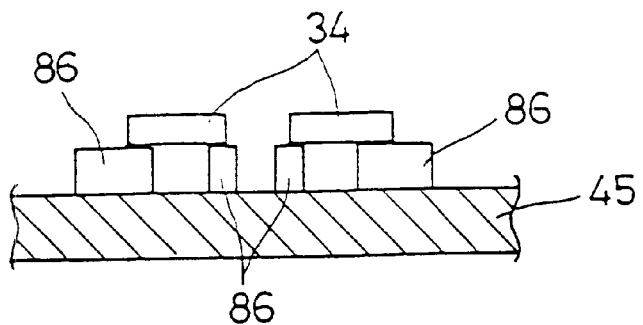
FIGS. 33A to 33C are schematic diagrams showing various steps subsequent to the steps shown in FIG. 32E.

Then, a finishing plating layer 85 of, for example, gold, is formed on over the copper patterns 84 such that interconnections 86 shown in FIG. 32E are formed. The interconnections 86 will serve as the high-frequency circuit interconnections 36A, 37A, the DC circuit interconnections 38A, 39, and the bias terminals 40 to 44. After forming the interconnections 86, the chip components 34 are soldered between the predetermined interconnections 86, as shown in FIG. 33A.

Figure 33B:
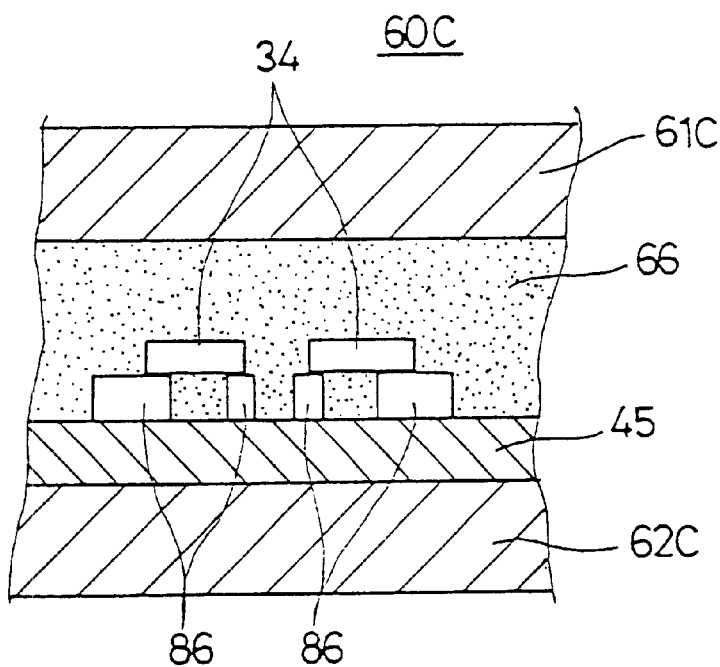

After the interconnections 86 and the chip components 34 are provided on the base material 45, a molding process is implemented for forming the resin package 35 on the base material 35. In the molding process, as shown in FIG. 33B, the base material 45 is placed in the mold 60C and the resin 66 is injected on the upper surface of the base material whereon the chip components 34 and the interconnections 86 are formed.

Figure 33C:
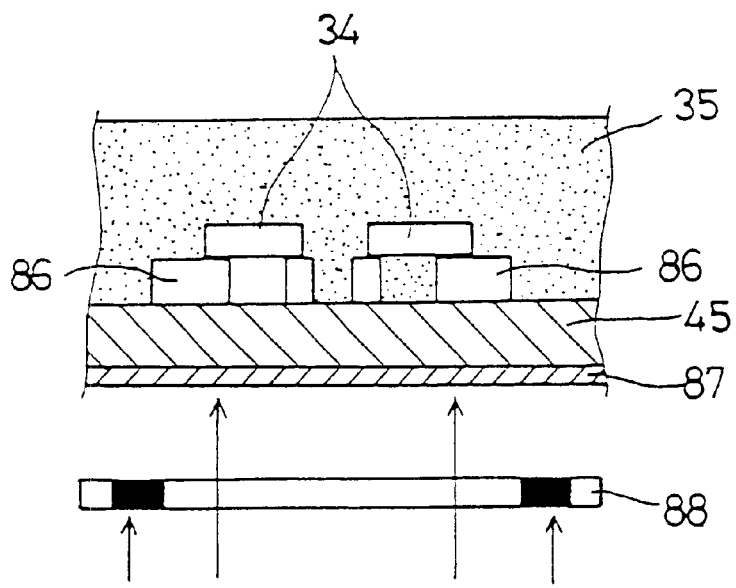

Then, after the above-described molding process when the resin package is provided on the base material 45, the dry film 87 of photo-sensitive resin is provided on the lower surface of the base material 45 as shown in FIG. 33C. Then, the dry film 87 undergoes an exposure process using a glass mask 88 having a predetermined pattern.

The dry film 87 used herein is also a photo-sensitive resin of a negative type. The pattern formed on the glass mask 88 is configured such that the light is irradiated at portions where via holes 50 are not formed.

Figure 34A:
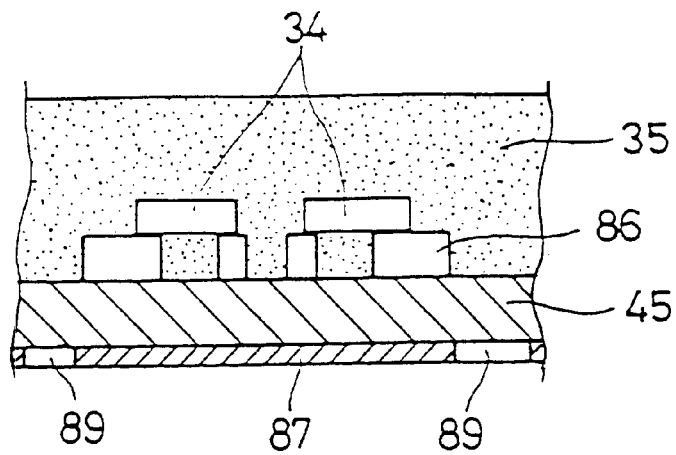
FIGS. 34A and 34B are schematic diagrams showing various steps subsequent to the step shown in FIG. 33C.
Figure 34B:
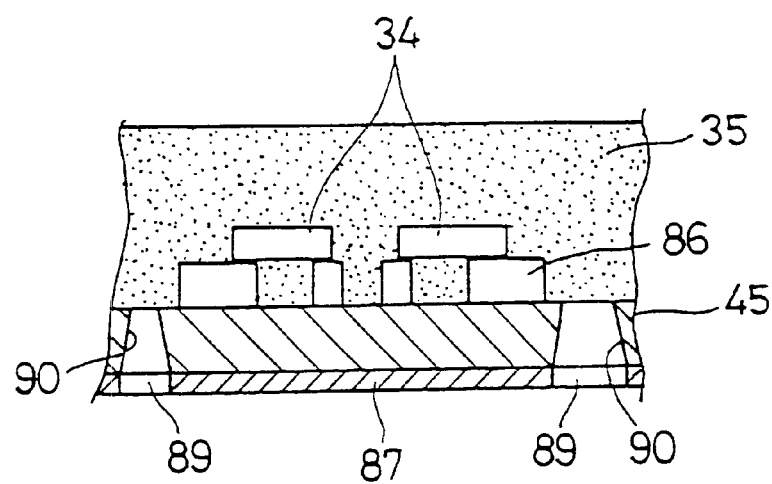

After exposure, a development process is implemented. As shown in FIG. 34A, the dry film 87 is provided with openings 89 provided at positions opposing the via holes 50. Then, polyimide etching is implemented using the dry film 87 as a mask. Thus, as shown in FIG. 34B, through-holes 90 are formed in the base material 45.

Figure 34C:
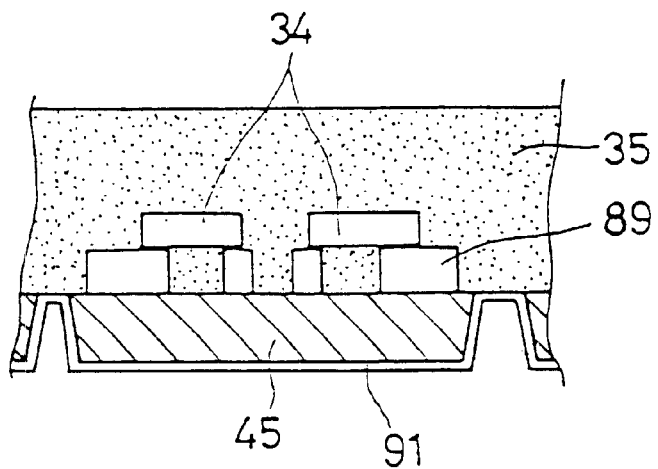

Then, as shown in FIG. 34C, a copper layer 91 is formed on the second surface of the base material 45 having the through-holes 90. In order to provide the copper layer 91, firstly, a thin film of copper is formed by copper sputtering and then a flush copper plating is implemented.

Figure 35A:
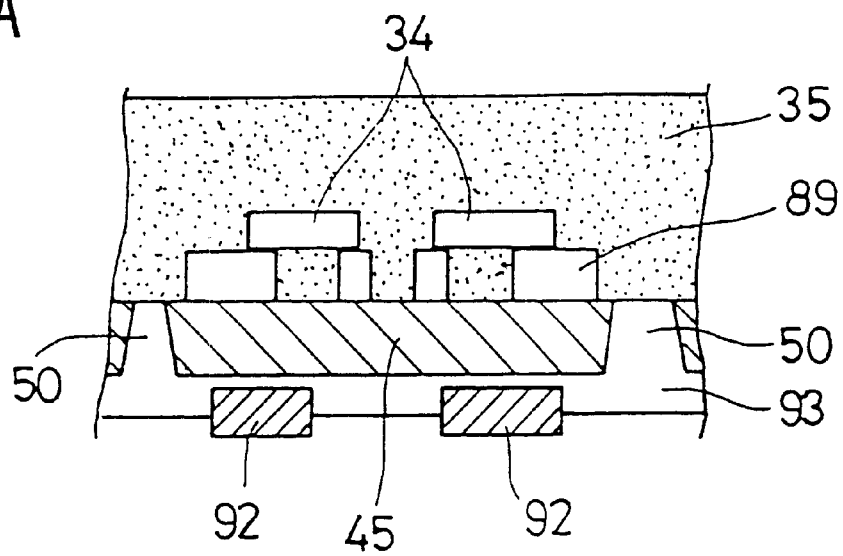
FIGS. 35A and 35B are schematic diagrams showing various steps subsequent to the steps shown in FIG. 34B.

When the copper layer 91 is formed, processes similar to those described with reference to FIGS. 31C to 32B are implemented. As shown in FIG. 35A, using the dry film 92 as a mask, a copper plating body 93 is formed. The copper plating body 93 is formed by electrolytic plating using the copper layer 91 as electrodes. Also, since the copper plating body is also formed in the through-holes 90, the via holes 50 are formed.

Figure 35B:
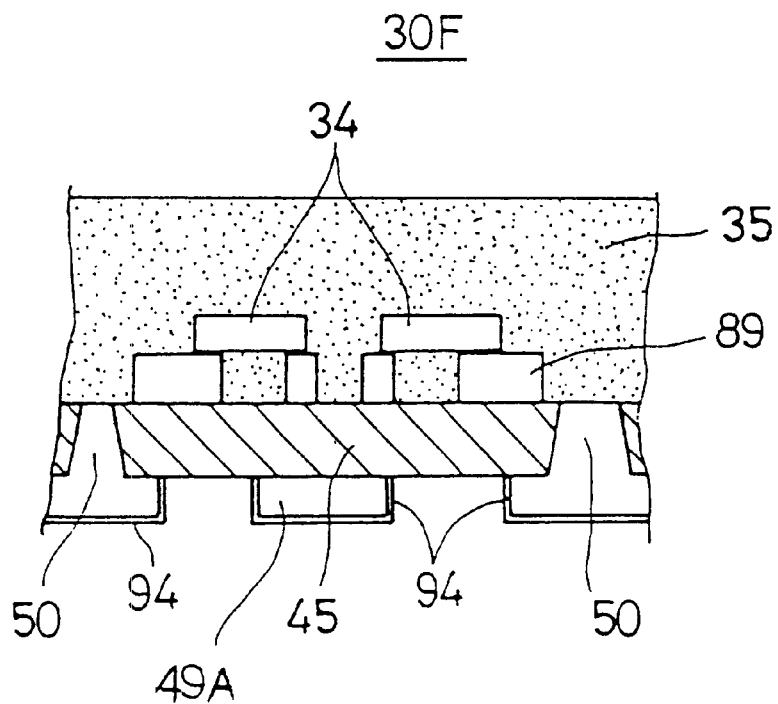

After the copper plating body 93 is formed 30 in the above-described manner, the dry film 92 is removed. Then, the copper plating body 93 undergoes a flush etching process, so as to provide independent copper patterns. Then, a finishing plating layer 94 of, for example, gold is formed over the copper patterns. 35 Accordingly, as shown in FIG. 35B, the high-frequency module 30F having the via holes 50 and the land portions 49A is manufactured.

Now, a molding process of the resin package 35 of the above-described method will be described in detail.

As has been described above, the deformation of the base material 45 during the molding process is due to unleveled portions produced before molding as a result of the formation of the land portions 49A of the second surface of the base material 45. However, with the manufacturing method of the present embodiment, the resin package 35 is formed before forming the land portions 49A on the base material, or, before the second surface of the base material 45 becomes unleveled.

Thus, as shown in FIG. 33B, during the molding process, the second surface of the base material 45 is flat and thus there is no gap between the lower mold 62C of the mold 60C and the base material 45. Therefore, even if the base material 45 is biased due to pressure exerted by the resin 66 during molding, the base material 45 is supported by the lower mold 62C and its deformation will be restricted. The present embodiment also restricts the deformation of the base material 45 during molding. Therefore, it is also possible in the present embodiment to prevent the chip components 34 from falling off from the interconnections 86 and the interconnections 86 from peeling off from the base material 45. Further, it is possible to prevent the interconnections 86 from being disconnected due to stress applied thereto.

In the embodiments described above, a transfer molding process has been described as an example of a method of forming the resin package 35. However, it is to be noted that the method of forming the resin package 35 is not limited thereto. Instead, it can be widely applied for cases where a resin forming method is used in which biasing force is exerted on a high frequency circuit board while forming the resin package 35 by method such as compression molding.

Further, the present invention is not limited to these embodiments., but variations and modifications may be made without departing from the scope of the present invention.

The present application is based on Japanese priority application No. 2000-196965 filed on Jun. 29, 2000, the entire contents of which are hereby incorporated by reference.

What is claimed is:

1. A method of molding resin on a substrate having a first surface provided with an electronic circuit and a second, uneven surface opposite said first surface, said method comprising the steps of:
   a) providing a deformation restricting element having a complementary uneven surface relative to the second, uneven surface of said substrate;
   b) assembling the substrate and the deformation restricting element with the respective, complementary uneven surfaces in mating relationship; and
   c) molding said resin on said first surface.

2. A method of molding resin on a thin-film resin substrate having a first surface provided with an electronic circuit and a second, uneven surface, opposite said first surface and having a first configuration of raised portions and recessed portions, said method comprising the steps of:
   a) providing a deformation restricting element for, and assembling same with, said substrate, said element comprising at least one sub-member that fills said recessed portions of said second surface; and
   b) molding said resin on said first surface.

3. The method as claimed in claim 2, wherein said sub-member is made of a thermally resistive hard resin having a surface with a second configuration of raised portions and recessed portions which is a negative the first configuration of said second, uneven surface of said thin-film substrate.

4. The method as claimed in claim 2, wherein each said sub-member comprises a further thin-film resin substrate having a common structure as that of said thin-film resin substrate to be resin molded.

5. The method as claimed in claim 2, wherein each said sub-member is made of an elastically deformable material.

6. The method as claimed in claim 5, wherein each said sub-member is a sheet member made of polyimide resin.

7. The method as claimed in claim 2, wherein said deformation restricting element comprises interconnections of said electronic circuit, at least some of the interconnections extending over regions corresponding to said recessed portions.

8. The method as claimed in claim 2, wherein said deformation restricting element comprises supporting members located in said recessed portions of said second surface of said thin film substrate.

9. The method as claimed in claim 8, wherein said supporting members and electrodes are formed simultaneously such that said supporting members are electrically isolated from said raised portions.

10. The method as claimed in claim 2, wherein said deformation restricting element comprises:
   interconnections of said electronic circuit extending over regions corresponding to said recessed portions; and
   supporting members that support said thin-film resin substrate at said recessed portions of said second surface.

11. A method of molding resin on a thin-film resin substrate having a first surface provided with an electronic circuit and a second, uneven surface, opposite said first surface and having a first configuration of raised portions and recessed portions, said method comprising the steps of:
   a) providing a deformation restricting element for, and assembling same with, said substrate, said deformation restricting element comprising embedded members, each made of an insulating material that fills said recessed portions of said second surface; and
   b) molding said resin on said first surface.

12. The method as claimed in claim 11, further comprising the step of:
   c) removing said embedded members after said step c).

13. A method of molding resin on a thin-film resin substrate having a first surface provided with an electronic circuit and a second, uneven surface, opposite said first surface, having raised portions comprising electrodes and recessed portions, said method comprising the steps of:
   a) providing a deformation restricting element for, and assembling same with, said substrate, said element comprising at least one sub-member that fills said recessed portions of said second, uneven surface of said substrate;
   b) molding said resin on said first surface; and
   c) after said molding step b), forming said electrodes on said second surface.

14. A method of manufacturing a module, said method comprising the steps of:
   a) preparing a substrate having a first surface provided with an electronic circuit and a second, uneven surface opposite said first surface;
   b) providing a deformation restricting element having a complementary uneven surface for said substrate;
   c) placing said substrate and said deformation restricting element, with the respective, complementary uneven surfaces in mating relationship, in a mold; and
   d) injecting resin into said mold.

15. A method of manufacturing a high-frequency module, said method comprising the steps of:
   a) preparing a thin-film resin substrate having a first surface provided with an electronic circuit and a second, uneven surface having a first configuration of recessed and raised portions opposite said first surface;
   b) providing a deformation restricting element having a complementary uneven surface for said thin-film resin substrate;
   c) placing said thin-film resin substrate and said deformation restricting element in a mold with the respective, complementary uneven surfaces in a mating relationship; and
   d) injecting resin into said mold.

16. The method as claimed in claim 15, wherein said deformation restricting element comprises at least one sub-member that fills said recessed portions of said second surface of said thin film substrate.

17. The method as claimed in claim 16, wherein each said sub-member is made of a thermally resistive hard resin having an uneven surface with a second configuration of raised portions and recessed portions which is a negative of the first configuration of said second, uneven surface of said thin-film substrate.

18. The method as claimed in claim 16, wherein each said sub-member comprises a further thin-film resin substrate having a common structure as that of said thin-film resin substrate to be resin molded.

19. The method as claimed in claim 16, wherein each said sub-member is made of an elastically deformable material.

20. The method as claimed in claim 19, wherein each said sub-member is a sheet member made of polyimide resin.

21. The method as claimed in claim 15, wherein said deformation restricting element comprises embedded members, each made of an insulating material.

22. The method as claimed in claim 21, further comprising the step of:
   e) removing said embedded members after said step d).

23. The method as claimed in claim 15, wherein said deformation restricting element comprises:
   interconnections of said electronic circuit the interconnections extending over regions corresponding to said recessed portions.

24. The method as claimed in clam 15, wherein said deformation restricting element comprises supporting members located in said recessed portions of said second surface.

25. The method as claimed in claim 24, wherein said supporting members and electrodes are formed simultaneously such that said supporting members are electrically isolated from said raised portions.

26. The method as claimed in claim 15, wherein said deformation restricting element comprises:
   interconnections of said electronic circuit extending over regions corresponding to said recessed portions; and
   supporting members that support said thin-film resin substrate at said recessed portions of said second surface.

27. A method of manufacturing a high-frequency module, said method comprising the steps of:
   a) preparing a thin-film resin substrate having a first surface provided with an electronic circuit and a second, uneven surface opposite said first surface;
   b) providing a deformation restricting element having a complementary uneven surface relative to the second, uneven surface of said substrate for said thin-film resin substrate;
   c) placing said thin-film resin substrate and said deformation restricting element in a mold with the respective, complementary uneven surface in mating relationship; and
   d) injecting resin into said mold.

* * * * *